United States Patent
Baker et al.

(10) Patent No.: US 9,438,181 B1
(45) Date of Patent: Sep. 6, 2016

(54) AMPLIFICATION OF SIGNALS OUTPUT FROM BRIDGE-TIED LOAD AUDIO AMPLIFIERS

(71) Applicants: David D. Baker, Gilbert, AZ (US); James C. Strickland, Mesa, AZ (US)

(72) Inventors: David D. Baker, Gilbert, AZ (US); James C. Strickland, Mesa, AZ (US)

(73) Assignee: Rockford Corporation, Tempe, AZ (US)

( * ) Notice: Subject to any disclaimer, the term of this patent is extended or adjusted under 35 U.S.C. 154(b) by 0 days.

(21) Appl. No.: 14/805,454

(22) Filed: Jul. 21, 2015

(51) Int. Cl.
*H03F 3/217* (2006.01)
*H03F 3/181* (2006.01)

(52) U.S. Cl.
CPC ..................................... *H03F 3/181* (2013.01)

(58) Field of Classification Search
CPC ............................... H03F 3/217; H03F 3/181
USPC .............................................. 330/207 A, 251
See application file for complete search history.

(56) References Cited

U.S. PATENT DOCUMENTS

| | | | |
|---|---|---|---|
| 4,433,306 A | 2/1984 | Honda et al. | 330/297 |
| 4,517,528 A | 5/1985 | Tanaka et al. | 330/297 |
| 5,194,821 A | 3/1993 | Brambilla et al. | 330/51 |
| 6,636,103 B2 | 10/2003 | Wurcer et al. | 327/536 |
| 7,103,189 B2 | 9/2006 | Ford | 381/123 |
| 7,239,206 B2 | 7/2007 | D'Amore | 330/297 |
| 7,834,702 B2 | 11/2010 | Jones et al. | 330/297 |
| 7,990,196 B2 | 8/2011 | Voegele | 327/178 |
| 8,212,620 B2 | 7/2012 | Strickland et al. | 330/297 |
| 8,311,243 B2 | 11/2012 | Tucker et al. | 381/120 |
| 2013/0033328 A1 | 2/2013 | Jones et al. | 330/297 |

FOREIGN PATENT DOCUMENTS

| | | |
|---|---|---|
| DE | 4410498 A1 | 10/1994 |
| JP | 5567504 A | 1/1981 |
| JP | H06291561 | 10/1994 |

OTHER PUBLICATIONS

CEA Standard, Testing & Measurement Methods for Mobile Audio Amplifiers, CEA-2006-B, Feb. 2009, 18 pages.
CEA Standard, Testing & Measurement Methods for Mobile Audio Amplifiers, CEA-490-A R-2008, Dec. 2001, 33 pages.
Texas Instruments, MC3x063A 1.5-A Peak Boost/Buck/Inverting Switching Regulators, Jan. 2015, 30 pages.
Texas Instruments, TL07x Low-Noise JFET-Input Operational Amplifiers, Feb. 2014, 49 pages.
International Rectifier, PowIRaudio, IR43x1 Product Summary, Apr. 2013, 15 pages.

*Primary Examiner* — Henry Choe
(74) *Attorney, Agent, or Firm* — The Patent Source

(57) ABSTRACT

Disclosed boost amplifiers are used with a BTL amplifier that outputs balanced audio signals and that has an output current capacity and a dynamic power capacity. Disclosed amplifiers include an audio amplifier with a dynamic power capacity and that amplifies the balanced audio signals and applies them to a load, at least one diode that receives audio signals and produces single-ended input power signals, and at least one regulator that converts the single-ended input power signal into a regulated power signal of a higher magnitude. The boost regulator presenting a variable input impedance to the BTL amplifier such that the output current capacity of the BTL amplifier is not exceeded. Disclosed amplifiers also include a DC power reservoir that stores power from the regulated power signal and supplies sufficient power that the dynamic output power capacity of the audio amplifier exceeds the dynamic power capacity of the BTL amplifier.

20 Claims, 18 Drawing Sheets

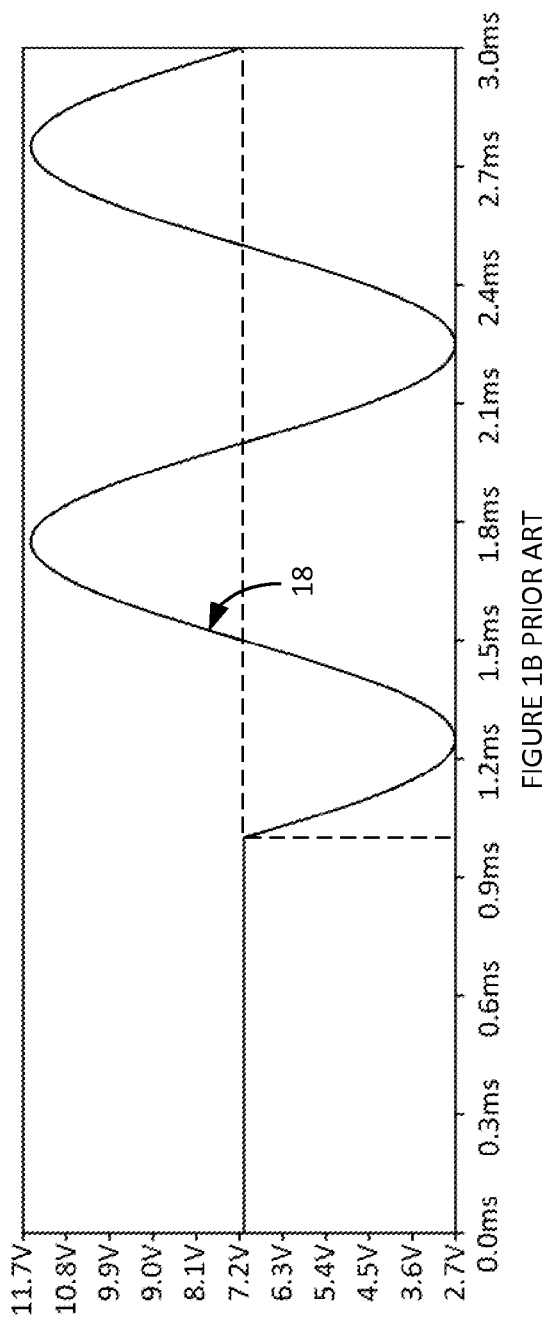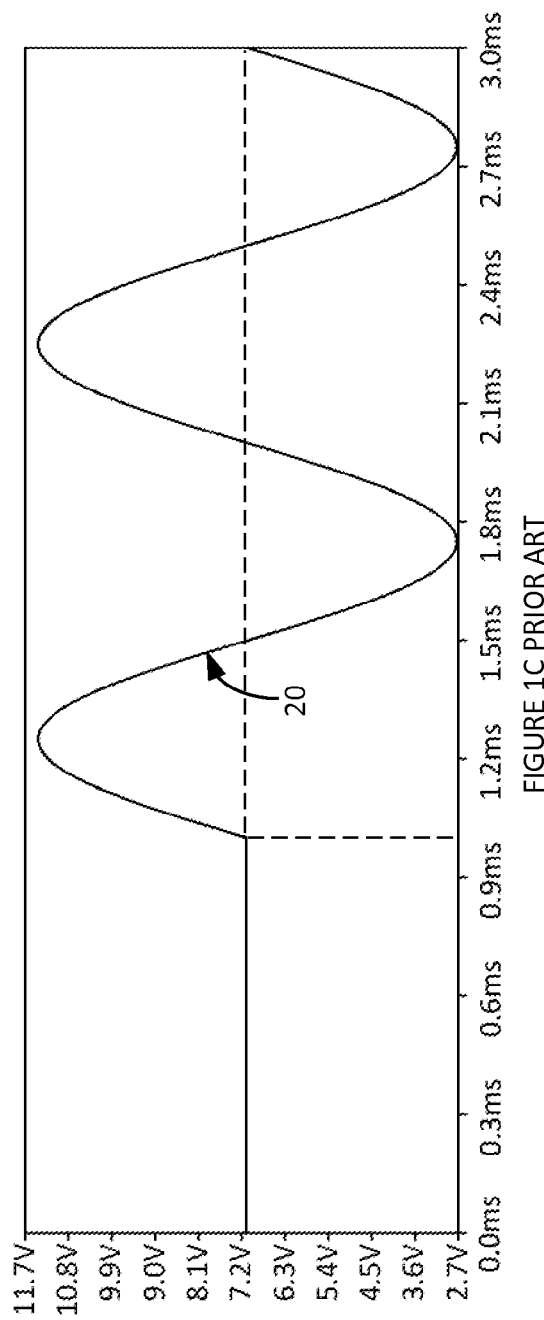

LOW V REGULATOR

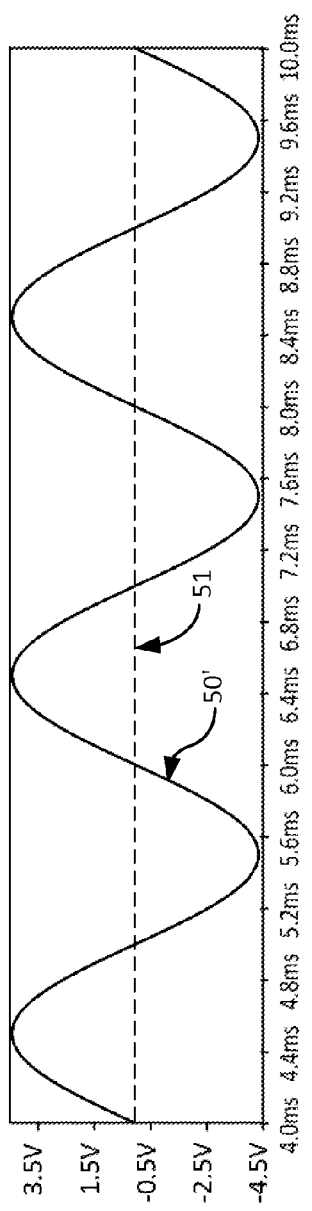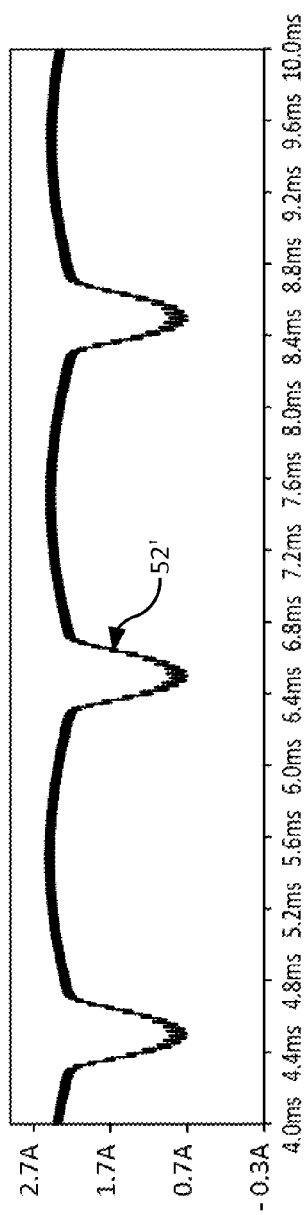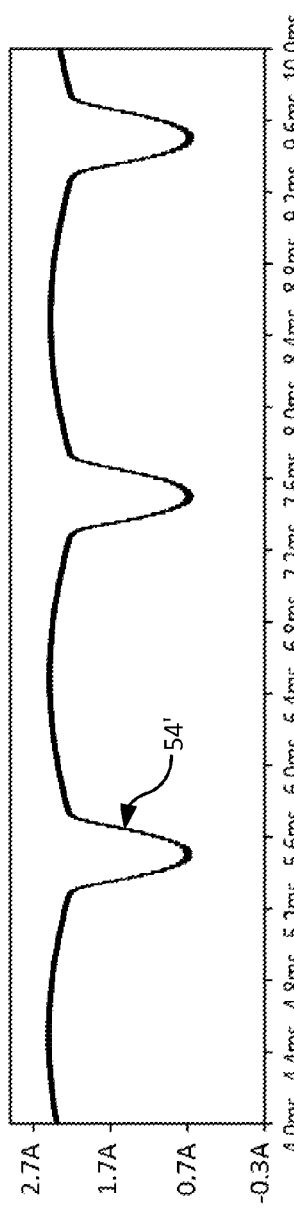

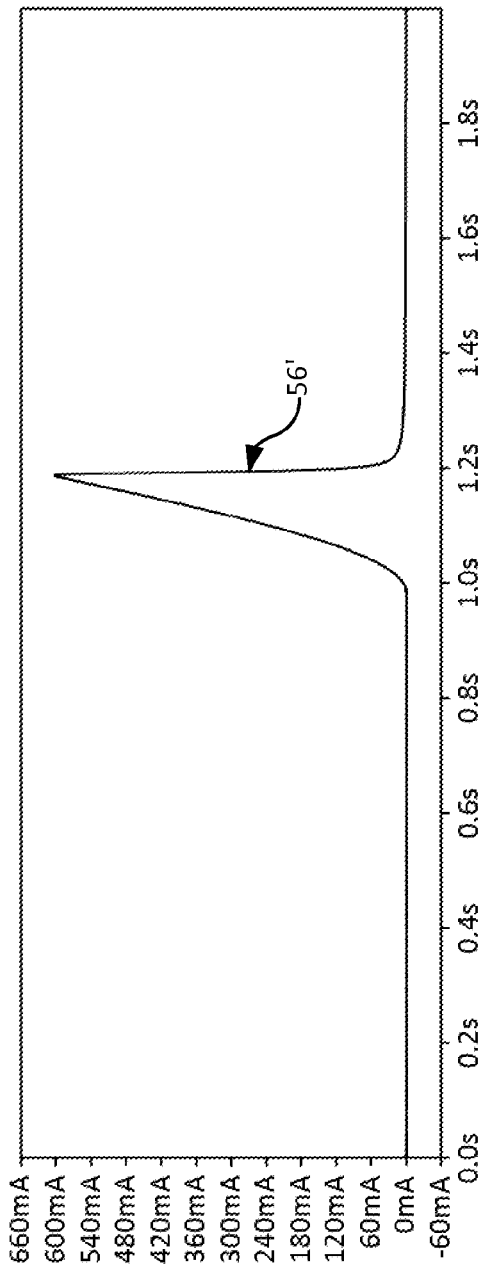
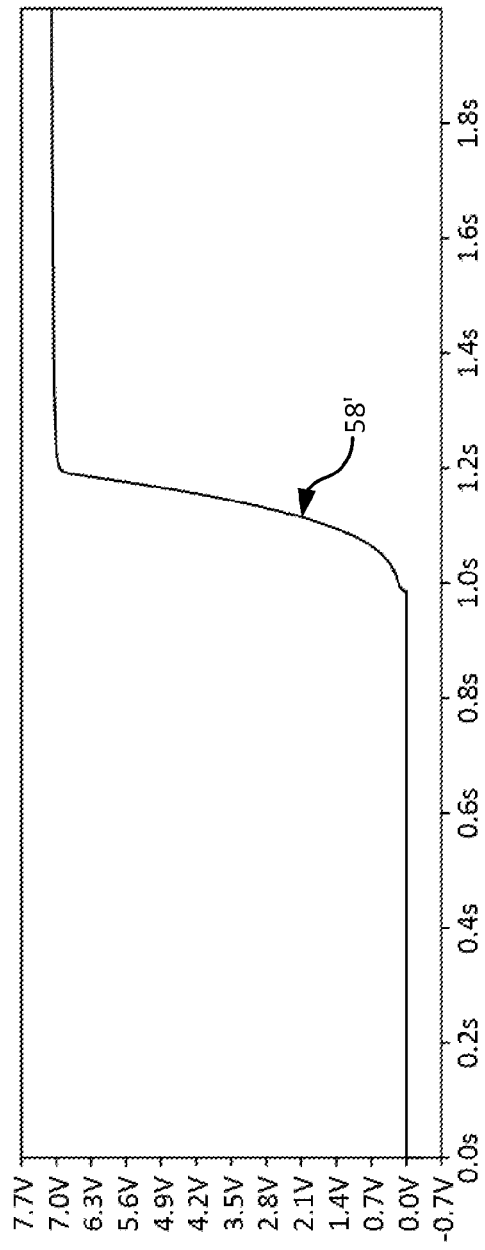

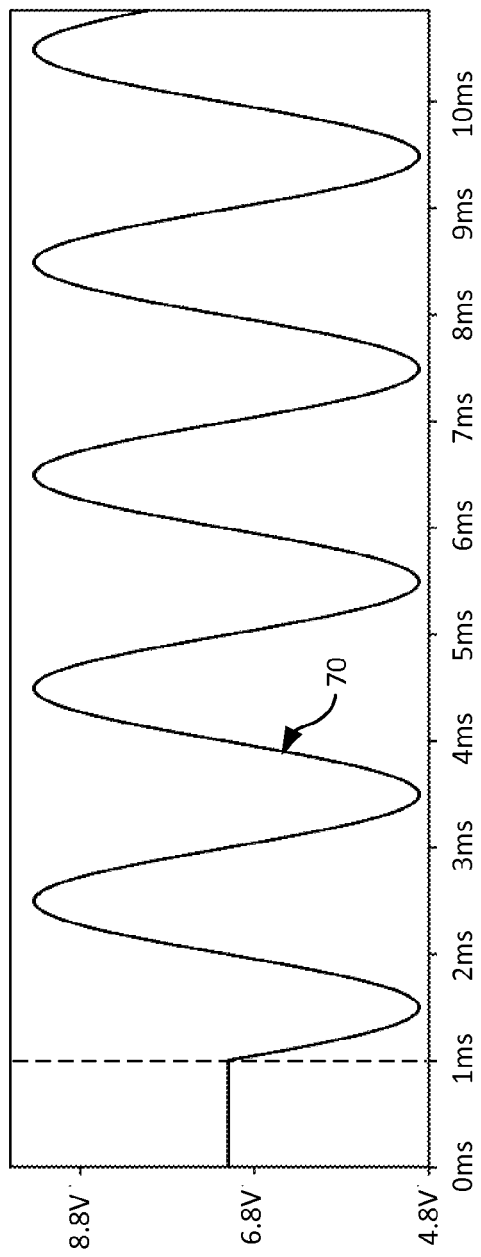
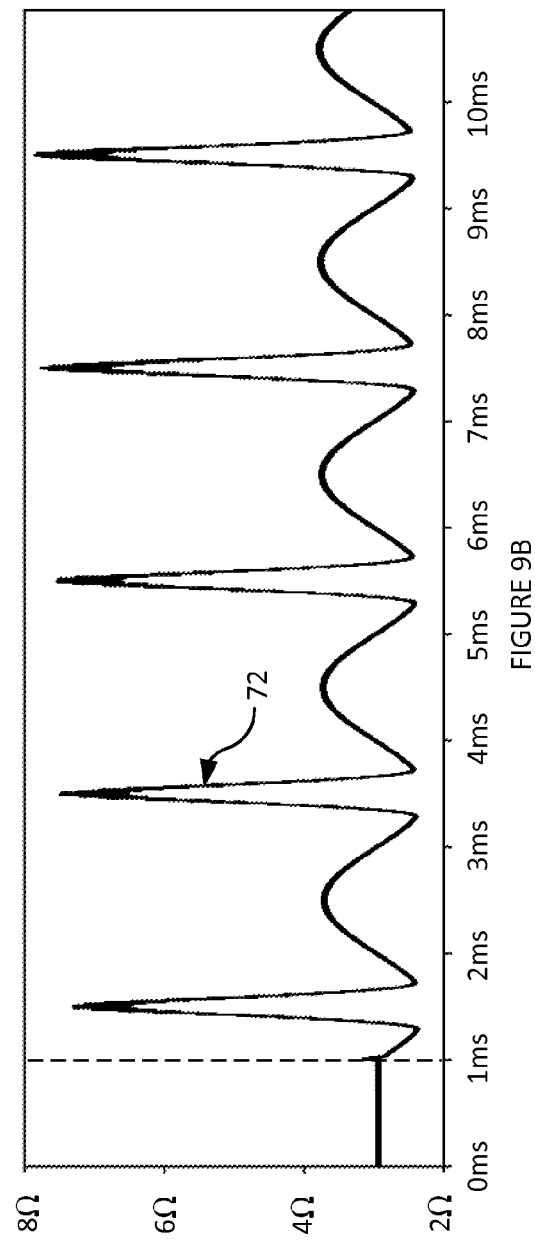
FIGURE 9A PRIOR ART
FIGURE 9B

AMPLIFICATION OF SIGNALS OUTPUT FROM BRIDGE-TIED LOAD AUDIO AMPLIFIERS

BACKGROUND OF THE INVENTION

1. Field of the Invention

The present invention is directed to systems, methods, and/or apparatus that utilize the output of an audio bridge-tied-load (BTL) amplifier as the source of both power and audio signals to perform audio amplification not possible with the BTL amplifier alone. Accordingly, the general objects of the invention are to provide novel systems, methods, and/or apparatus of such character.

2. Description of the Related Art

The majority of automobiles produced today have audio systems specifically tailored to the vehicle by the vehicle manufacturer. These audio systems typically have the capability to receive audio information from a variety of audio media sources such as radio, CD, MP3, etc. The audio media is converted to electrical audio signals which are amplified by one or more amplifiers, and then applied to speakers that produce audible sounds.

Many vehicle manufacturers utilize BTL (bridge-tied-load) amplifier configurations. The term bridge is used to describe the output stage of the BTL amplifier, in which the output is arranged in a full bridged configuration. The full bridge configuration can be viewed as two separate amplifier stages sharing the same voltage source and audio input signal. One of the amplifiers audio input stage is configured as non-inverting and the other's audio input stage is configured as inverting. The non-inverting amplifier forms the non-inverting output of the BTL amplifier. The inverting amplifier forms the inverting output of the BTL amplifier. The speaker load is connected between the two outputs forming a bridge. Both outputs produce opposite output voltages simultaneously which results in a balanced BTL amplifier output. The positive speaker input is connected to the non-inverting output of the amplifier. The negative speaker input is connected to the inverting output of the amplifier. The amplifier output signal presented to the speaker is a differential signal with equal and opposite polarity signals delivered to each side of the load.

When no output signal is present, the non-inverting and inverting outputs of the BTL are at a DC voltage between the vehicles battery voltage and ground. Usually the DC value is half of the vehicles primary DC voltage. Typically the primary DC voltage is provided by the vehicle's battery. With no output signal present, a typical 13.8 Vdc vehicle battery would yield around 6.9 Vdc at both the non-inverting and inverting BTL amplifier outputs with respect to vehicle battery ground. With no output signal present, no current will flow through the speaker load due to the equal DC voltage found on both output terminals of the BTL amplifier. When audio signal is present, the power output devices of the BTL amplifier conduct through the speaker load alternately between positive and negative transitions of the audio signal.

The regulated nominal DC output voltage of a vehicle's electrical system when the vehicle engine is running is around 13.8 Vdc. This DC value can either increase or decrease depending on the electrical load and or RPM (revolutions per minute) of the vehicle's engine. Typically the DC output voltage of the vehicle is regulated to a value below 14.4 Vdc. When the vehicle's engine is not running the nominal DC voltage is typically an unregulated 12.5 Vdc.

In stock audio systems, the BTL amplifier's source voltage is generally the same value as the vehicle battery voltage. Utilizing the full bridge output method yields quadruple the amplifier output power compared to half bridge amplifier configurations wired into the same value load. The output power level produced by the stock BTL amplifier, powered by the primary vehicle DC voltage, into the stock speakers is generally considered adequate by the vehicle manufacturer. Every conventional BTL amplifier for use with a vehicle has an output current capacity and a dynamic output power capacity that are, ultimately, limited by the vehicle's battery.

FIG. 1A represents a typical configuration for a conventional Bridged-Tied Load (BTL) amplifier 10. As shown, two essentially separate amplifiers are joined together through a load 16 at terminals 12 and 14. The audio signal is applied to the non-inverting input of one amplifier AMP 1 and the inverting input of the other amplifier AMP 2. As is known, each of the balanced audio signals of the BTL amplifier has a zero-crossing point at which the polarity of the balanced audio signals reverses.

Both amplifiers AMP1 and AMP 2 share a common DC voltage source. In a typical conventional application such as an automobile audio amplifier, the DC voltage source is a battery voltage. It is also shown that the reference point for both amplifiers is half of the source voltage (HALF BATTERY VOLTAGE). The half source voltage is applied to both sides of the load when no signal is present. When signal is applied, both bipolar positive and negative audio signals 18 and 20 alternate between the source voltage and ground about a DC midpoint (7.2 volts) as shown in FIGS. 1B and 1C. When driving a resistive load, the output current level would be proportional to the output voltage level.

FIGS. 1D and 1E show total worst case power dissipation in the output devices of the BTL amplifier when connected through a 4 Ohm resistor driven for 3 cycles at 1 kHz. FIG. 1D (waveform 22) shows the 1 kHz output voltage waveform of the BTL amplifier. FIG. 1E (waveform 24) shows the total worst case dissipation in the output transistors for the output waveform shown in 1D. The total average power dissipation of M1, M2, M3, and M4 in FIG. 1A under this condition is 10 Watts. When the BTL amplifier is connected to the inputs of the invention, M1 and M3 source power and dissipate heat. M4 and M2 do not source power and their heat contribution to the BTL amplifier heat sink is negligible. The total average power dissipation of M1 and M2 with the invention connected to the output of the BTL amplifier, and the same 3 cycle worst case conditions, is 13 Watts.

SUMMARY OF THE INVENTION

The present invention provides methods, systems, and apparatus that utilize the audio power output capacity of a bridge-tied load (BTL) amplifier as both a power source and an audio source for further audio amplification to thereby provide increased dynamic output power capacity compared to the preceding BTL amplifier alone into the same load.

In one form, the invention may be directed to a boost amplifier that may be used with a BTL amplifier that outputs balanced audio signals and that has an output current capacity and a dynamic power capacity. Inventive boost amplifiers may include an audio amplifier that has a dynamic power capacity that amplifies the balanced audio signals, and applies them to a load. Inventive boost amplifiers may also include at least one diode that receives audio signals and produces single-ended input power signals, and at least one regulator that converts the single-ended input power signal into a regulated power signal of a higher magnitude. The boost regulator may present variable input impedance to the BTL amplifier such that the output current capacity of the BTL amplifier is not exceeded. Finally, the boost amplifiers in accordance with the invention may also include a DC power reservoir that is the only power source for the audio amplifier. The DC power reservoir may store power from the regulated power signal and supply sufficient power that the dynamic output power capacity of the audio amplifier exceeds the dynamic power capacity of the BTL amplifier.

In the present invention, the dynamic power rating is significantly higher than continuous RMS power rating. For example, the present invention may have a continuous RMS rating of 20 Wrms and a dynamic power rating of 100 Wrms. The dynamic power rating compared to continuous RMS power rating is determined by the energy storage capacity in the boost amplifier DC power reservoir. The inventive boost amplifier sources energy from its DC power reservoir when the power delivered to its loads exceeds the capacity of the stock amplifier's power output capacity. Conversely, energy is stored in the DC power reservoir during times when the amplifier's load demand is below the preceding BTL amplifier's power output capacity.

According to the audio power amplifier standard CEA-RS-490-A R 2008, and the mobile power amplifier standard CEA-2006-B, the dynamic power capacity of an amplifier into a given load can be determined by applying a 1 kHz sine wave for 20 ms at maximum amplifier output. This is considered the loaded condition. The loaded condition is then followed by a 1 kHz sine wave for 480 ms at 20 dB below the maximum amplifier output voltage. This is considered the unloaded condition. The test condition is repeated 20 times and the average RMS power output during the loaded condition is considered the dynamic power output capacity of the amplifier. The maximum dynamic power output of the amplifier is the average loaded RMS power output level at 1% total harmonic distortion and is measured in Watts.

According to CEA-2006-B, the continuous RMS power rating of a mobile amplifier is "the square of the minimum RMS voltage delivered by the device during a measurement duration of one minute at the reference supply voltage (14.4 Vdc+/−0.2V) into the reference load (4 Ohms+/−5%) with all channels driven, across the emplifier's [sic] stated operating bandwidth (or, if not stated, as defined in section 5.4) while maintaining no more than 1% THD+N, divided by 4 Ohms."

Numerous other advantages and features of the present invention will become apparent to those of ordinary skill in the art from the following detailed description of the preferred embodiments, from the claims and from the accompanying drawings.

BRIEF DESCRIPTION OF THE DRAWINGS

The preferred embodiments of the present invention will be described below with reference to the accompanying drawings wherein like numerals represent like steps and/or structures and wherein.

Figure 1A:
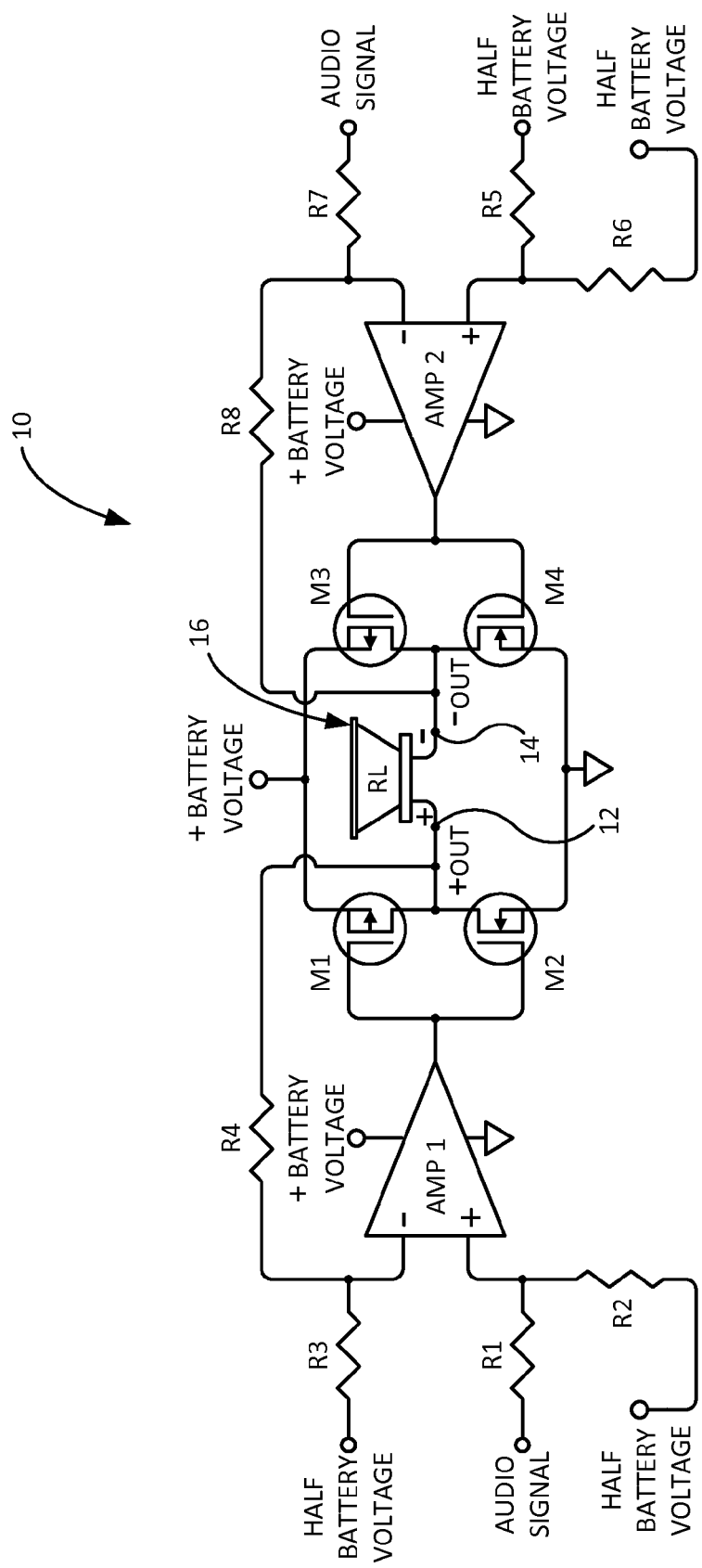
FIG. 1A is a typical prior art BTL amplifier output stage depicting an H bridge.
Figure 1D:
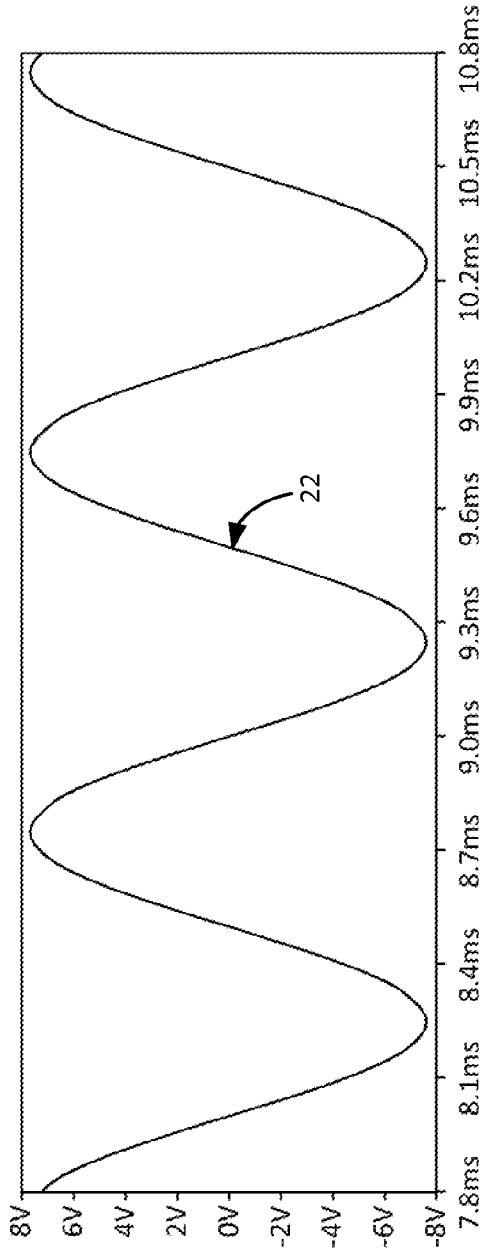
FIG. 1D shows the differentially measured output voltage waveform of the preceding prior art BTL amplifier.
Figure 1E:
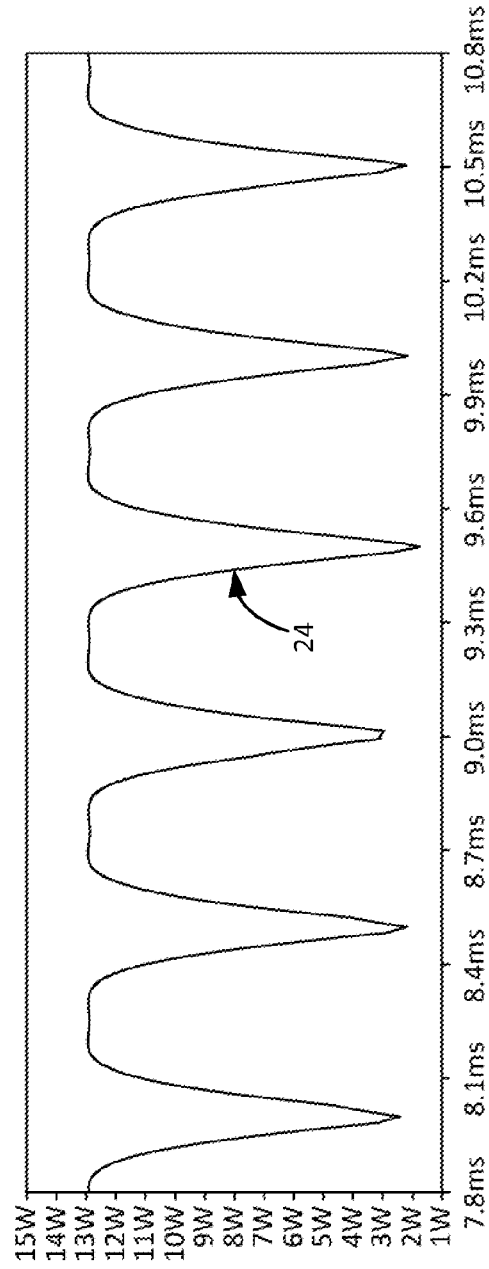
FIGS. 1B and 1C shows typical prior art BTL amplifier output signal waveforms.
Figure 2:
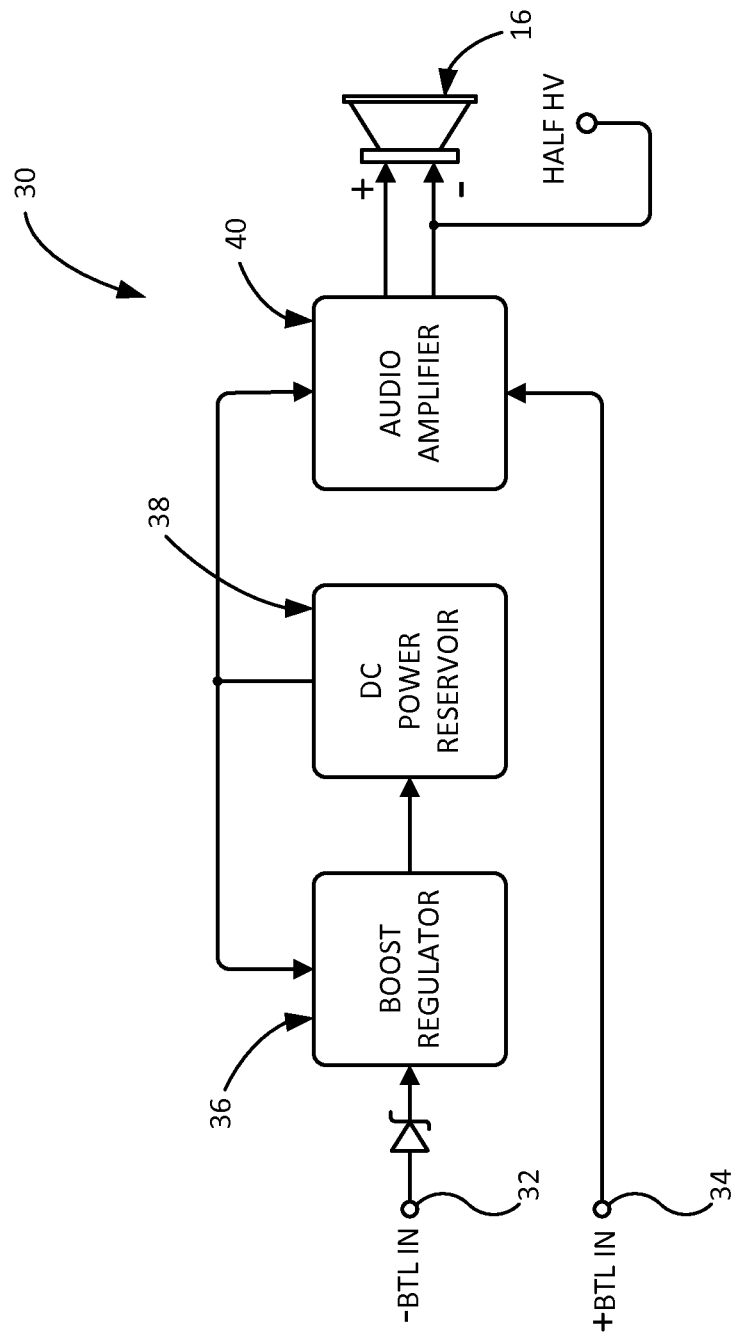
Figure 2A:
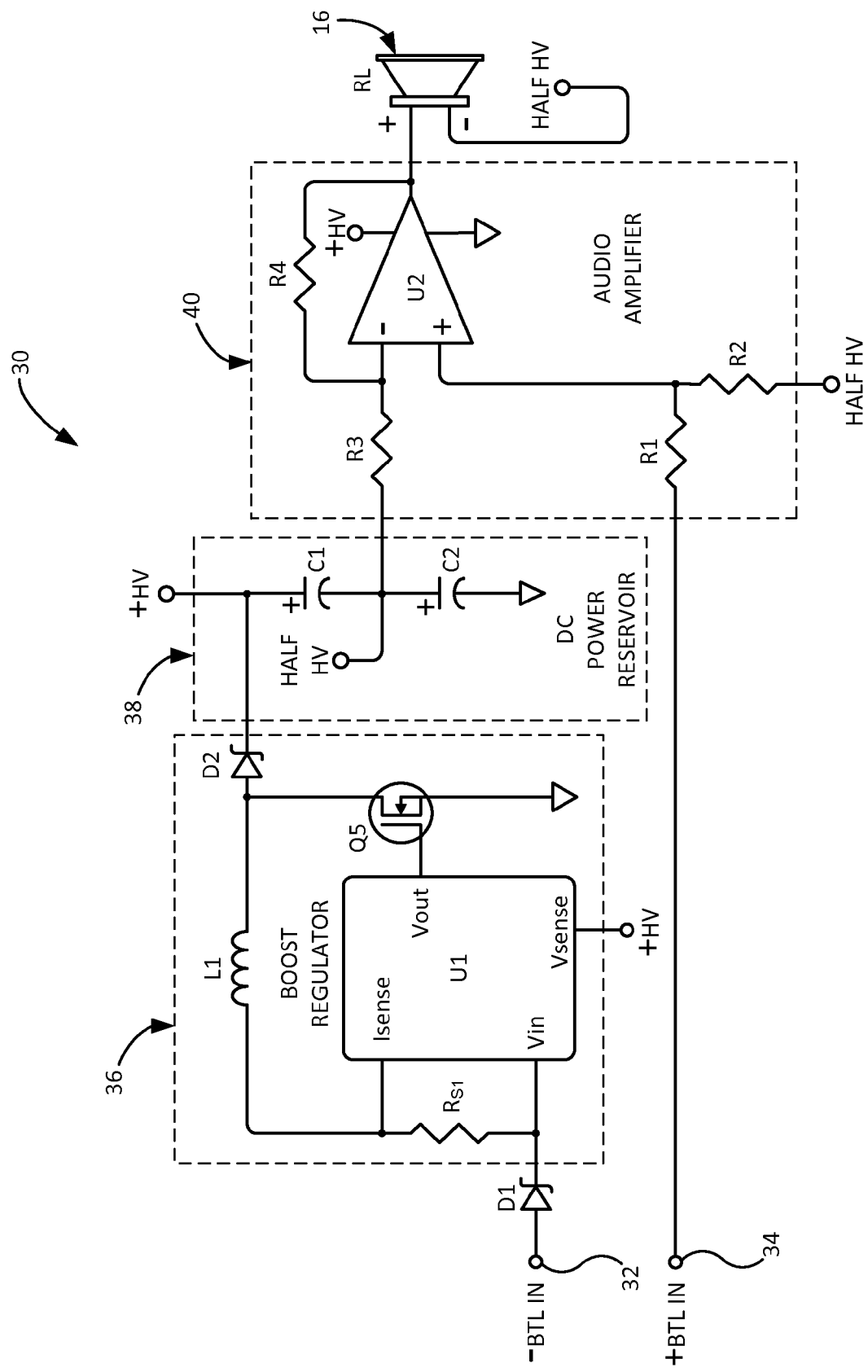
Figure 3:
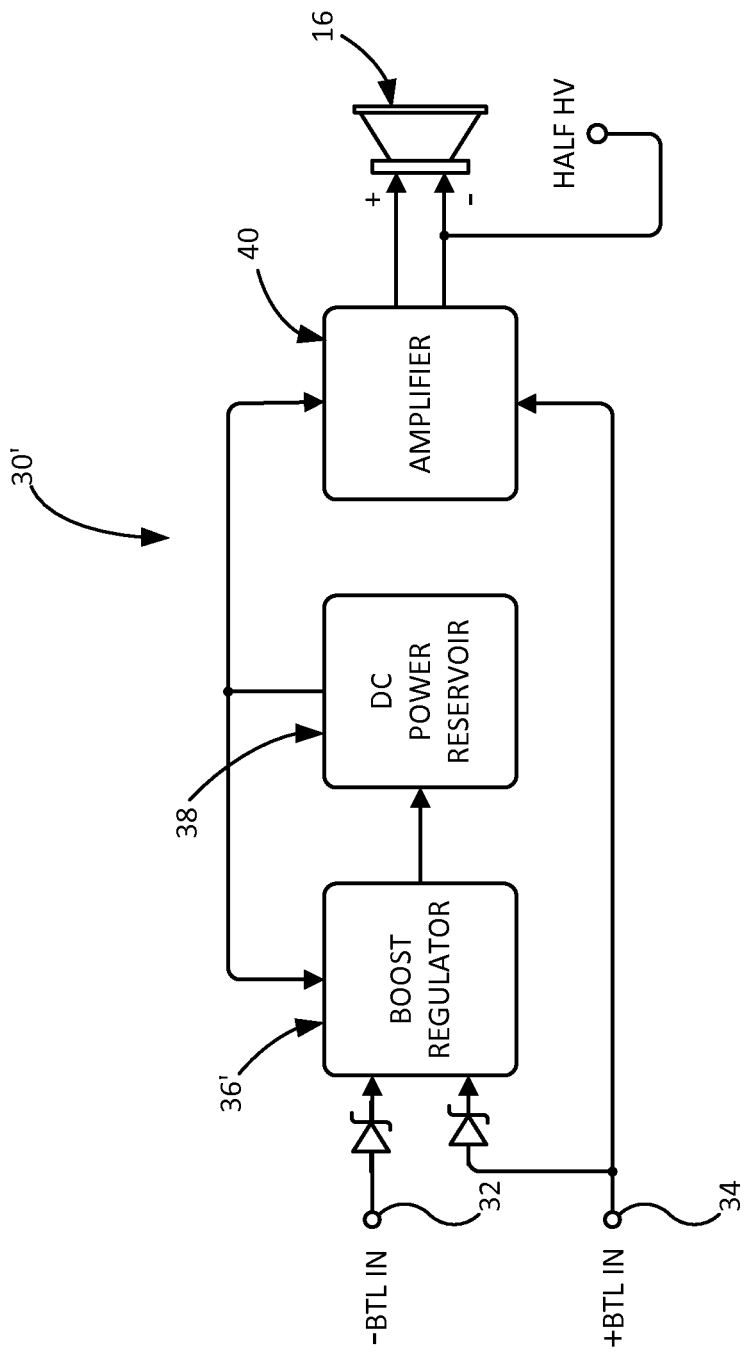
Figure 3A:
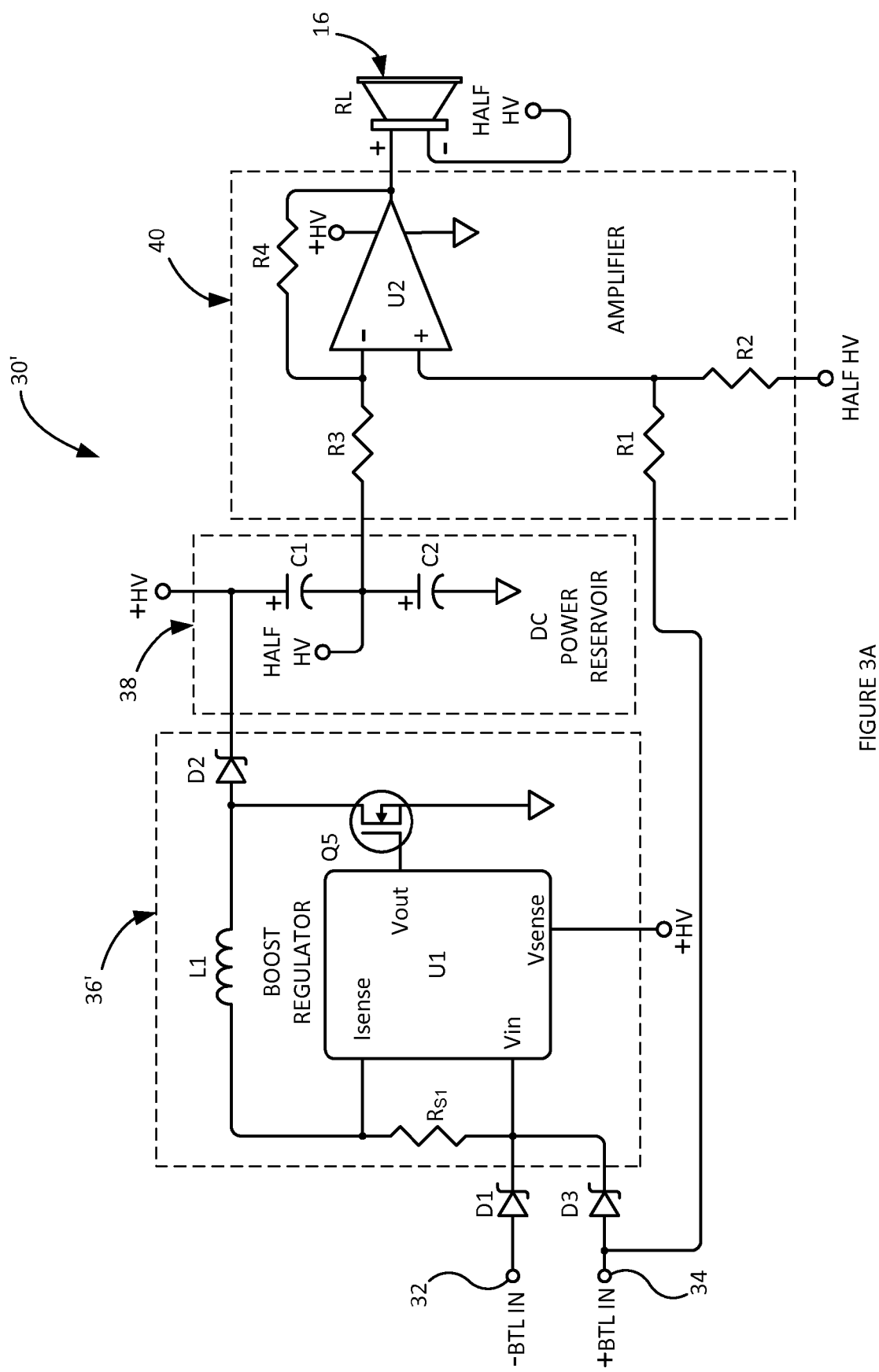
Figure 3B:
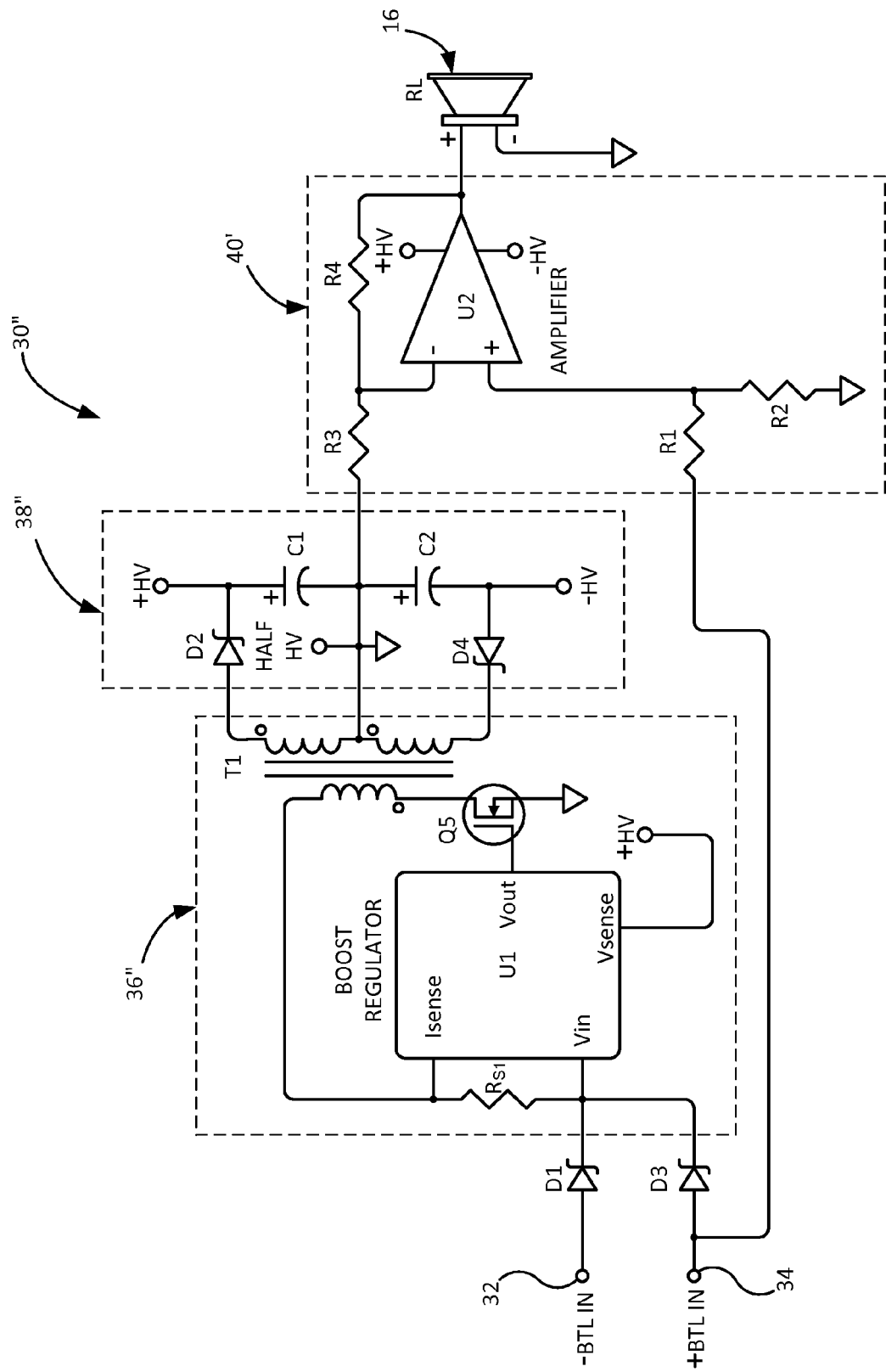
Figure 4A:
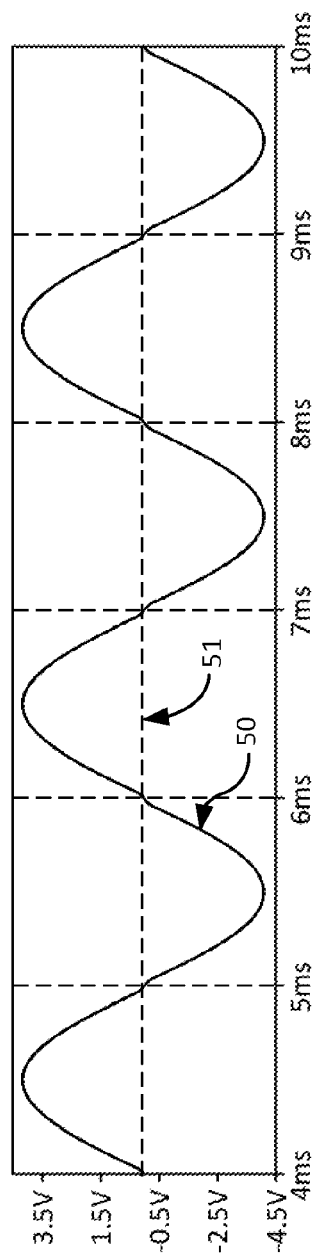

1E shows the combined power dissipation in the output devices of the preceding prior art BTL amplifier when the waveform of 1D is applied to a pure 4 Ohm resistor;

FIG. 2 is a functional block diagram of a first preferred audio boost amplifier of the invention, the embodiment utilizing one boost regulator;

FIG. 2A is a schematic representation of the electrical circuitry of the embodiment of FIG. 2;

FIG. 3 is a functional block diagram of a second preferred audio boost amplifier of the invention, the embodiment utilizing one boost regulator;

FIG. 3A is one schematic representation of the electrical circuitry of the embodiment of FIG. 3;

FIG. 3B is different schematic representation of the electrical circuitry of the embodiment of FIG. 3;

FIG. 4A shows the differentially measured balanced audio signals of the preceding prior art BTL amplifier when applied to the embodiment shown in FIGS. 3A and 3B.

Figure 4B:
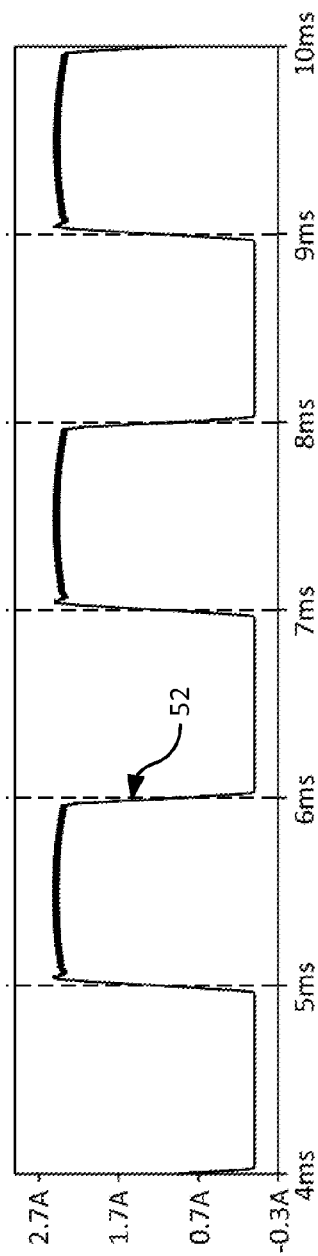
Figure 4C:
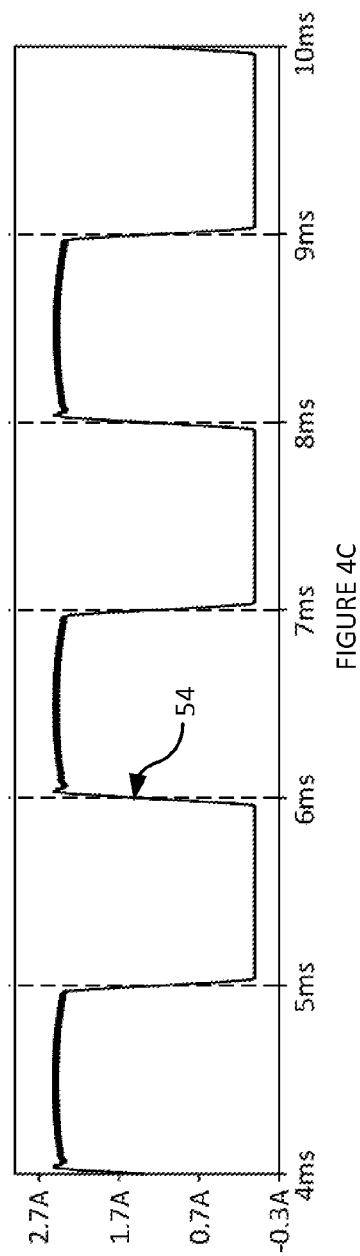
Figure 5A:
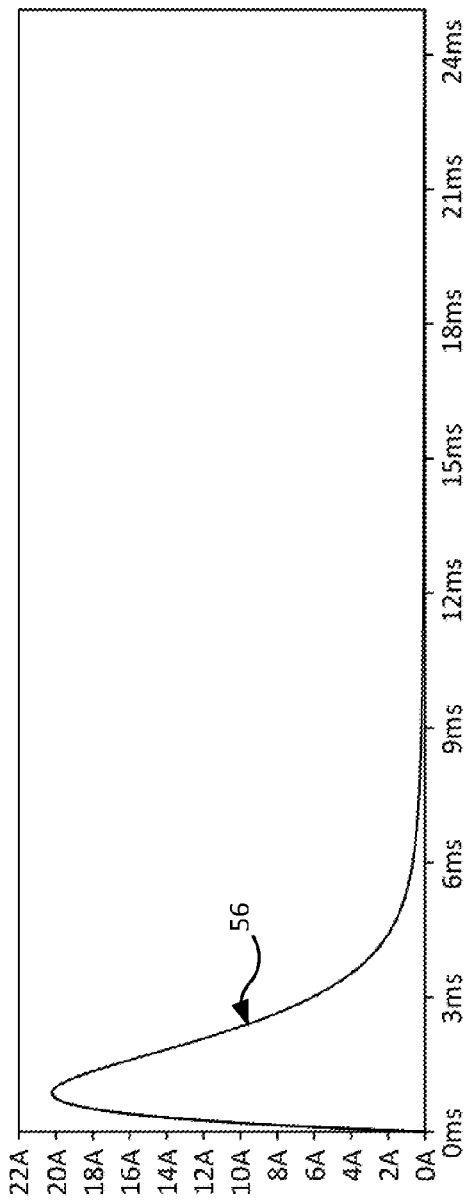
Figure 5B:
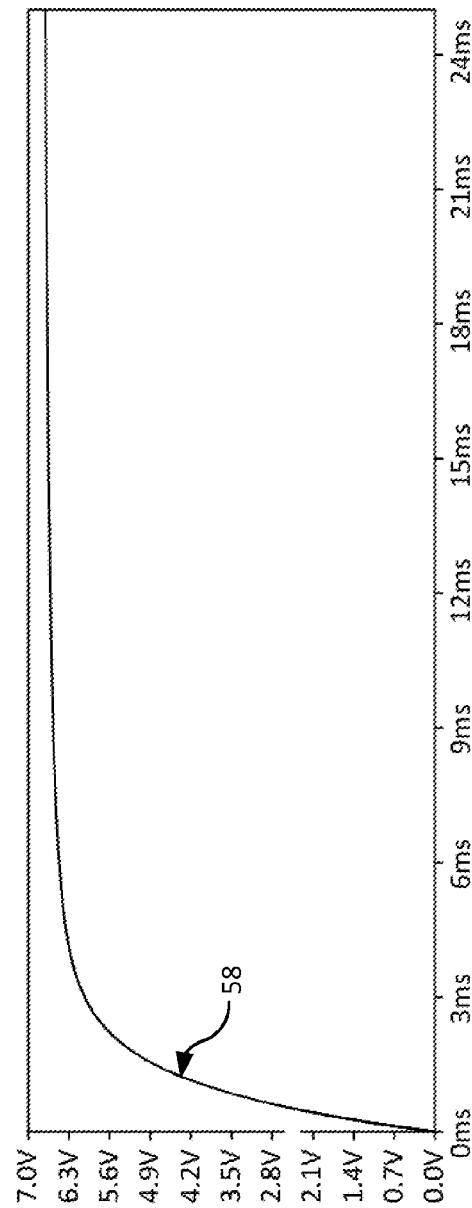
Figure 6:
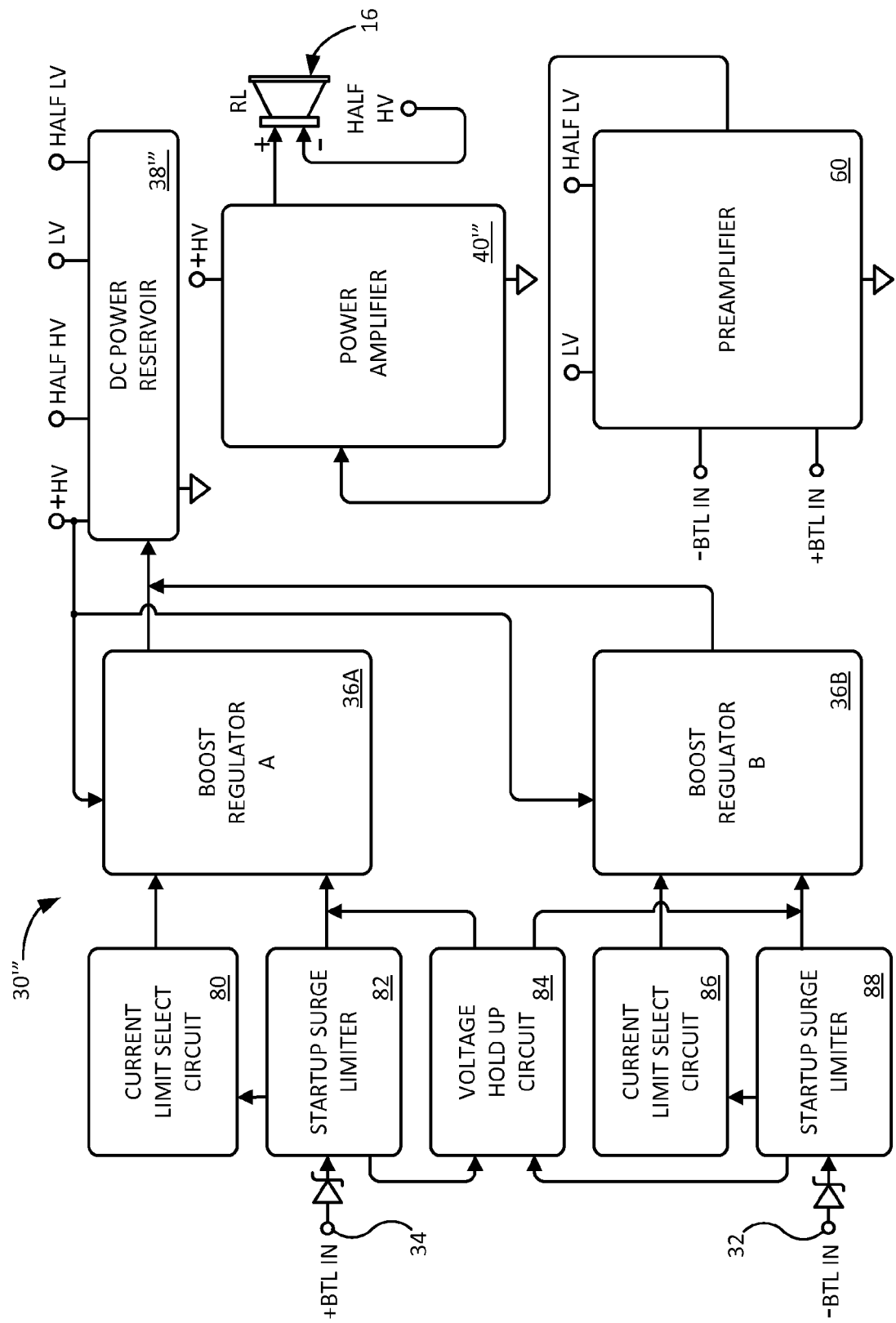
Figure 6A:
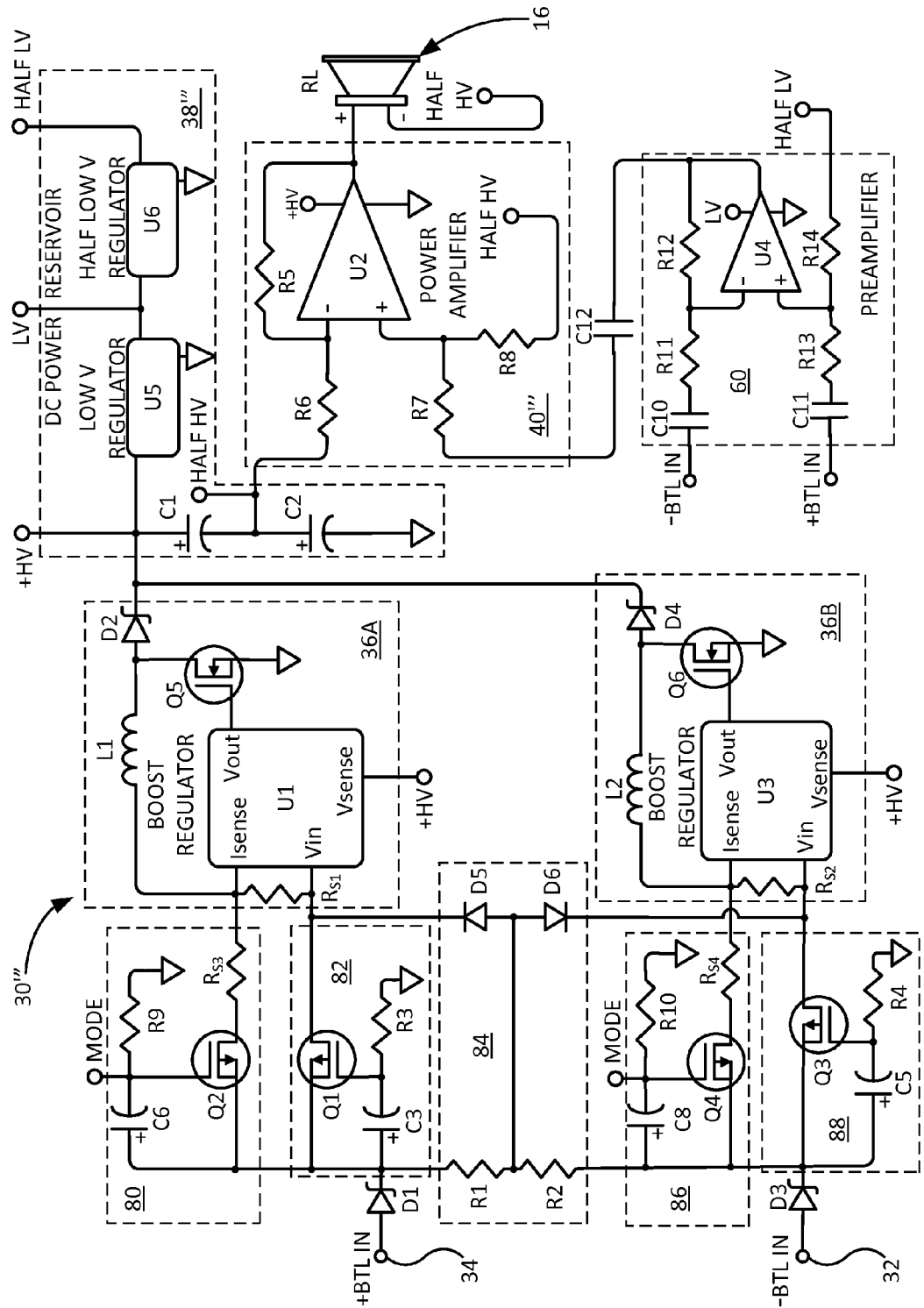
Figure 6B:
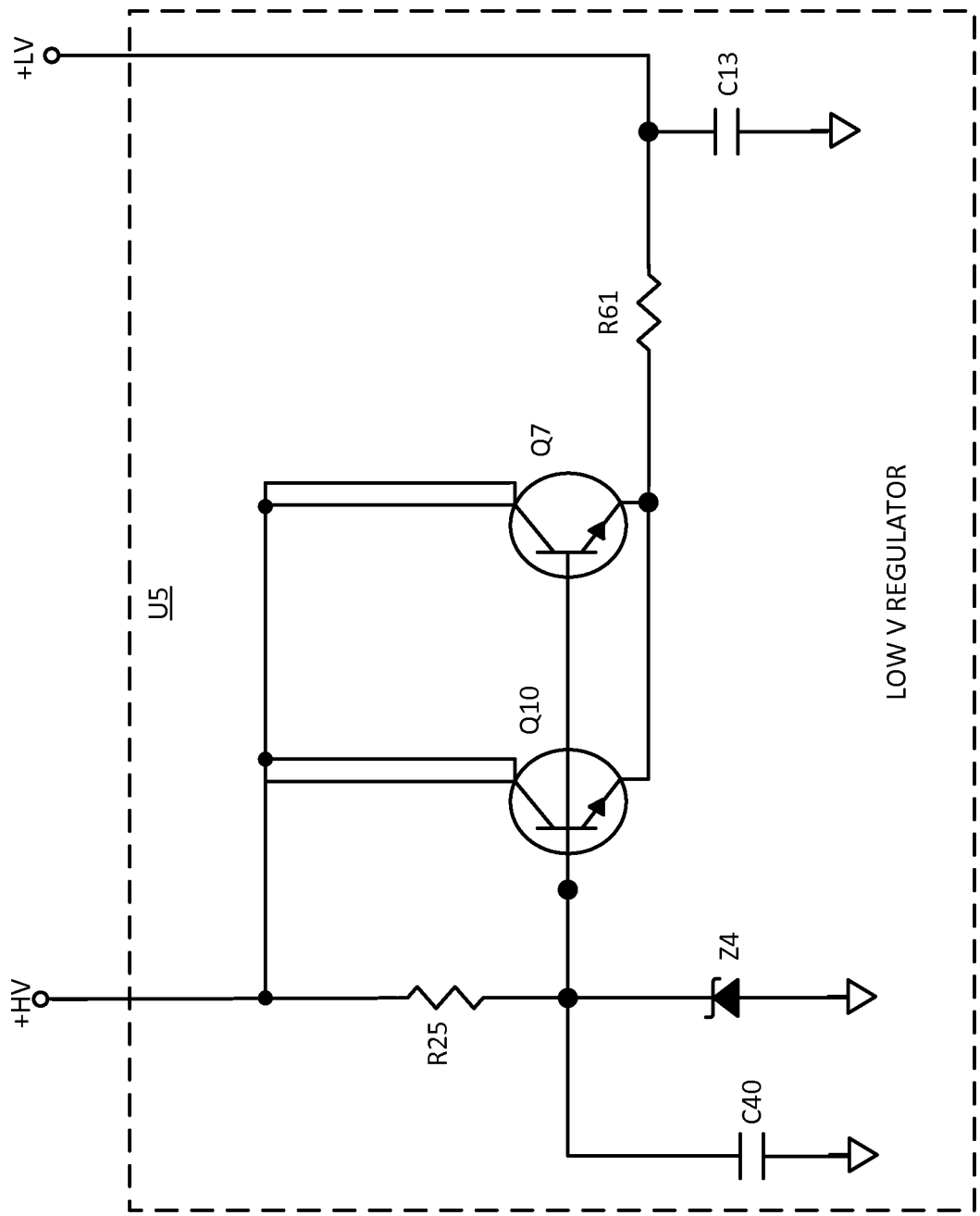
Figure 6C:
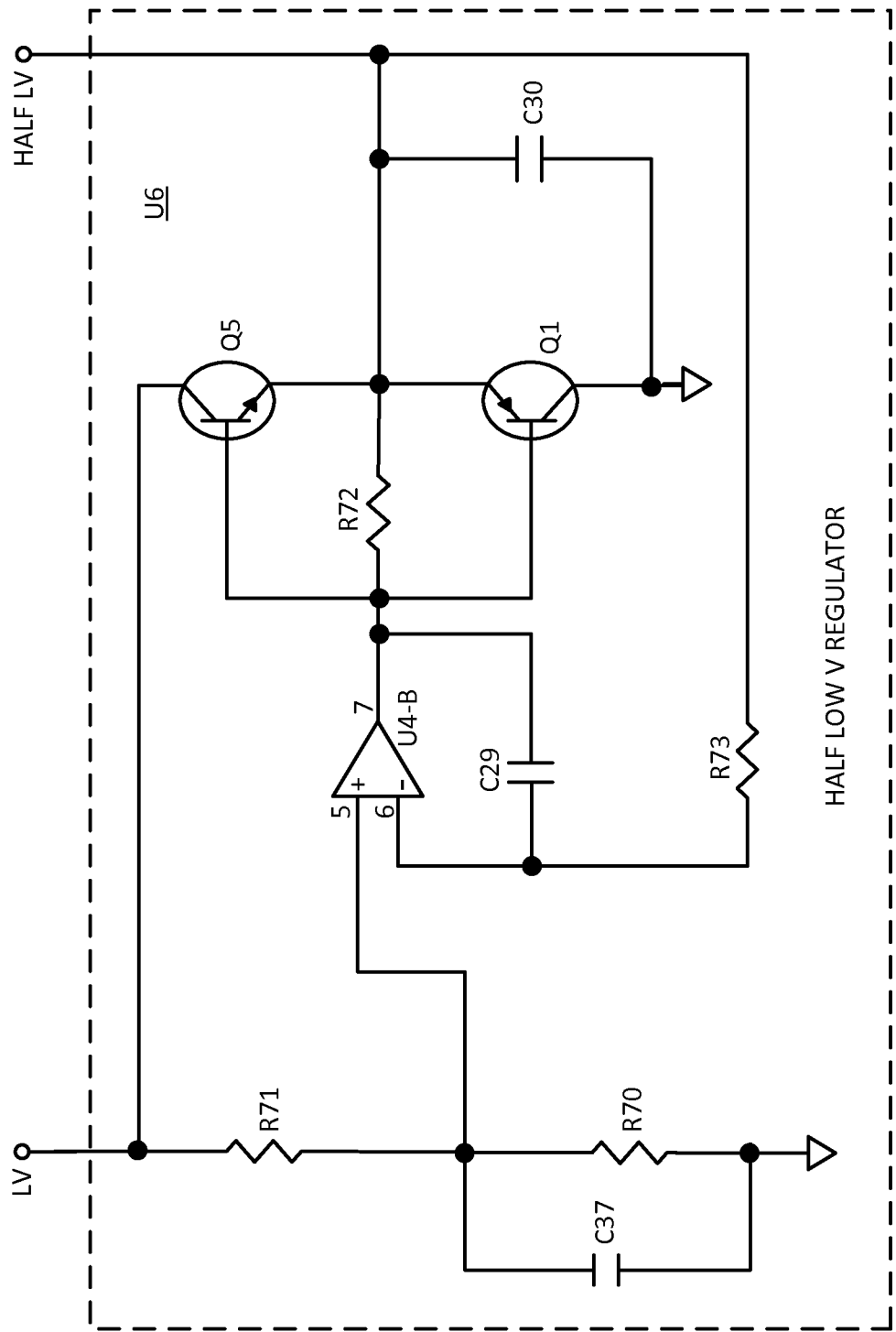

FIGS. 4B, and 4C show the input diodes' current conductions at the input of the invention of FIGS. 3A and 3B;

FIG. 5A shows the current through D1 or D3 of the invention at start up without the input surge current limiting circuitry;

FIG. 5B represents the output voltage at the inverting or non-inverting output of the preceding BTL amplifier at start up with no audio output signal;

FIG. 6 is a functional block diagram of a another preferred audio boost amplifier, the embodiment utilizing two boost regulators;

FIG. 6A is a schematic representation of the electrical circuitry of the embodiment of FIG. 6;

FIG. 6B is a schematic representation of the electrical circuitry of the low voltage regulator of the DC power reservoir shown in FIG. 6A;

FIG. 6C is a schematic representation of the electrical circuitry of the half low voltage regulator of the DC power reservoir shown in FIG. 6A;

FIG. 7A shows the differentially measured balanced audio signals of the preceding prior art BTL amplifier when applied to the embodiment shown in FIG. 6A.

Figure 10:
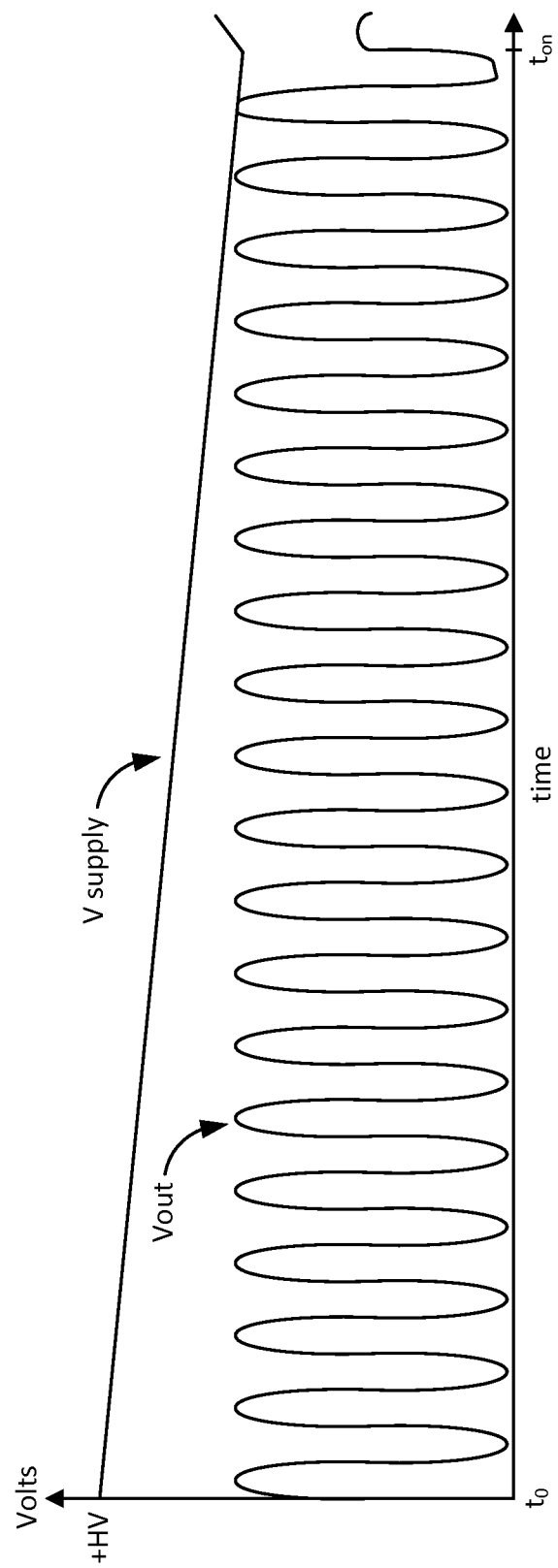

FIGS. 7B, and 7C show the input diodes' current conductions at the input of the preferred embodiment of FIG. 6A;

FIG. 8A shows the input current of the positive or negative amplifier's inputs with the surge current limiting shown in the preferred embodiment of FIGS. 6 and 6A during the preceding BTL amplifier's startup;

FIG. 8B shows the output voltage waveform of the startup surge limiters shown in the preferred embodiment of FIGS. 6 and 6A during the preceding amplifier's startup;

FIG. 9A shows a conventional single-ended −BTL audio signal as a function time;

FIG. 9B shows the input impedance of either of the positive and negative inputs of the amplifier embodiments shown in FIGS. 6 and 6A as a function of time; and FIG. 10 is a graph showing the drop in +HV during the period from t=0 to t=$t_{on}$ (20 cycles of the CEA dynamic power test).

DETAILED DESCRIPTION OF THE PREFERRED EMBODIMENTS

A first preferred boost amplifier 30 of the invention is shown in block diagram and schematic representation in FIGS. 2 and 2A, respectively. This basic embodiment of the inventive audio boost amplifier 30 uses BTL audio signals −BTL received at input 32 as the power source for the amplifier and audio signal +BTL received at input 34 as the audio source for the amplifier. As discussed below, this embodiment benefits from the simplicity of using only one boost regulator 36, but it is only capable of utilizing one half of the BTL amplifier's power output capacity. This embodiment also employs a simple single-ended DC power reservoir 38 and a simple audio amplifier 40 to drive a resistive load 16 (preferably an audio speaker). The DC power reservoir being the only power source for the audio amplifier (means for receiving and amplifying) and supplying sufficient power to the audio amplifier that the dynamic output power capacity of the audio amplifier exceeds the dynamic output power capacity of the BTL amplifier.

As with all preferred embodiments of the invention, the BTL amplifier (not shown here) acts as the signal and power source for the invention. As shown, the positive and negative inputs 34 and 32 (means for receiving) of the invention, respectively, accept the non-inverting and inverting signals +BTL and −BTL output from the preceding BTL amplifier (not shown). The positive signal +BTL is applied to amplifier 40 (means for receiving, amplifying, and applying), which may capable of amplifying voltage, current, or both voltage and current of the audio signal +BTL received. The negative signal −BTL is rectified by diode D1 (means for receiving and rectifying) (to thereby create a single-ended input power signal) and applied to the conventional boost converter U1, the inductor L1, and the transistor Q5 of the boost regulator 36 (regulator means, means for converting, and presenting). Regulator 36 converts the single-ended input power signal into a regulated power signal having a higher magnitude than the single-ended input power signal. By presenting variable input impedance to the BTL amplifier, the regulated power signal may provide a high power transfer rate to the boost amplifier while still ensuring that the output current capacity of the BTL amplifier is not exceeded. The resulting regulated power signal is then applied to the DC power reservoir 38 (means for storing and supplying) through diode D2 to thereby maintain a target reservoir voltage at least substantially equal to the predetermined magnitude of the regulated power signal. The outputs +HV and HALF HV of the DC power reservoir 38 are used as the sole power supply for audio amplifier 40. In particular, power amplifier 40 sources its power needs/requirements from reservoir 38 and delivers amplified audio signals to the speaker load RL/16 as desired.

An even more detailed understanding of the structural, electrical, and functional aspects of this embodiment will be readily apparent to those of ordinary skill in the art in light of the discussion below with respect to FIGS. 6 and 6A. Restated, except as expressly stated herein, the various components of this embodiment are either equivalent or identical to similarly identified components discussed below with respect to FIGS. 3 through 6C. Accordingly, description thereof need not be restated here and reference is made thereto. Similarly, identification of the various "means" expressly noted above is intended to apply to all other elements, components, items, etc. sharing like, similar, and/or derivative reference numerals presented throughout.

Turning now to the second preferred embodiment of the invention shown in block diagram and schematic representation in FIGS. 3 and 3A, respectively, the inventive amplifier 30' shown therein is identical to that of FIGS. 2 and 2A except as discussed herein. In particular, +BTL is also applied to amplifier 40 and both positive and negative inputs 34 and 32 of the invention accept the respective output signals of the preceding BTL amplifier (not shown) and apply them to slightly modified boost regulator 36'. Inputs 34 and 32 are electrically isolated from one another by the use of input diodes D1 and D3. Signals passing through D1 and D3 (means for receiving and rectifying) are then combined and applied to conventional boost converter U1 of boost regulator 36'. The resulting regulated power signal is then applied to the DC power reservoir 38 which supplies the power for audio amplifier 40 as discussed herein with respect to FIGS. 2, 2A,3, 3A, 6, and 6A. The power reservoir 38 is preferably the only power source for the audio amplifier and supplies sufficient power to the audio amplifier that the dynamic output power capacity of the audio amplifier exceeds the dynamic output power capacity of the BTL amplifier.

In the slightly modified embodiment of FIG. 3B, boost amplifier 30" creates bipolar DC regulated power signals by the use of transformer T1 in regulator 36" and diodes D2 and D4 in DC reservoir 38". Also, as shown, the bias midpoint of various components is ground because, in this embodiment, the midpoint of the bipolar DC power reservoir (HALF HV) is mid way between the equal and opposite voltages +HV and −HV which is 0V or ground. Otherwise, the operating principles of this embodiment are basically the same as those for FIG. 3A.

FIGS. 4A, 4B, and 4C show current conduction through diodes D1 and D3 (of single-ended power signals 52 and 54) of the inventive boost amplifier and one differentially measured BTL balanced audio signal 50 when applied to the embodiment shown in FIGS. 3 (and 3A and 3B). The audio signal 50 shown in FIG. 4A is taken differentially across the positive and negative outputs of the BTL amplifier. FIGS. 4B and 4C show that D1 and D3 transition in and out of conduction around the relatively small zero crossing point 51 of the voltage signal 50 waveform. The loss of conduction at zero crossing 51 is due the output of D1 and D3 forcing a reverse bias voltage upon each other during the positive and negative waveform transition. As a result, it can be seen that the BTL balanced audio signal 50 has distortion during its zero crossing 51. This undesirable distortion is due to the rapid change in load value during the BTL zero crossing 51. Because the same balanced BTL audio signal is used as the audio input to the amplifier, it is greatly preferred that the signal remain undistorted. Otherwise, the amplified signal applied to the load will also be distorted. Accordingly, this distortion represents a significant deficiency of the embodiments of FIGS. 3, 3A, and 3B. Solving this problem (as is done with respect to the embodiment of FIGS. 6 and 6A) represents a significant advance in the art.

Turning now to the preferred embodiment of FIG. 6, the aforementioned signal distortion is essentially eliminated when boost amplifier 30' is configured as in the preferred embodiment found in FIGS. 6 and 6A because diodes D1 and D3 have the ability to conduct current beyond the zero crossing region 51 of the BTL amplifier output. See FIGS. 7A, 7B, and 7C for a depiction of current conduction at the input of this embodiment versus a BTL amplifier output signal applied to this embodiment. This configuration also allows for higher power transfer from a BTL amplifier due to input conduction beyond the zero crossing regions 51.

FIG. 6 shows a block diagram of a fourth preferred audio amplifier 30''', the embodiment utilizing two switch mode boost regulators 36A and 36B. As with all preferred embodiments of the invention, the BTL amplifier acts as the audio signal and power source for the inventive boost amplifier. As shown, the positive and negative inputs of the invention +BTL and −BTL, respectively, accept the non-inverting and inverting outputs of the preceding BTL amplifier (not shown). The positive input +BTL is applied to diode D1 and the positive input of the preamplifier 60. The negative input −BTL is applied to diode D3, and the negative input of the preamplifier 60. The single-ended input power signals exiting D1 and D3 are also applied to their respective boost regulators 36A and 36B after passing through current limit select circuits 80 and 86 and startup surge limiters 82 and 88. Current surge limiters 82 and 88 keep current output from the BTL amplifier below the output current capacity of the BTL amplifier during an initial startup period. Regulators 36A and 36B convert the single-ended input power signals into regulated power signals having a higher magnitude than the single-ended input power signals. The resulting regulated power signals are then applied to the DC power reservoir 38''' through diodes D2 and D4 to thereby maintain a target reservoir voltage sufficient to supply power to the audio amplifier such that the dynamic power capacity of the audio amplifier is greater than that of the BTL amplifier. And, DC power reservoir 38''' outputs +HV, HALF HV, LV, and HALF LV for use throughout as shown. The power amplifier 40''' sources its power requirements from DC power reservoir 38''' and delivers amplified audio signals to the speaker load RL/16 as desired. Regulators 36A and 36B are powered by the single-ended input power signal applied to the "Vin" pins of converters U1 and U3.

FIG. 6A is a schematic diagram of the fourth preferred embodiment as shown in and described with respect to FIG. 6. With joint reference to FIGS. 6 and 6A, those of ordinary skill will readily appreciate that boost regulators 36A and 36B, current limit select circuits 80 and 86, and startup surge limiters 82 and 88 preferably share the same respective supporting component values and topologies. Accordingly, 36A/36B, 80/86, and 82/88 are preferably and respectively operationally equivalent and the functional description of either is directly applicable to the other unless expressly noted otherwise herein.

The BTL amplifier bipolar audio signals +BTL and −BTL are applied to the boost amplifier inputs, 34 and 32, respectively. As shown, the positive and negative inputs of this embodiment are electrically isolated from one another by, inter alia, diodes D1 and D3. The BTL amplifier audio signals are also applied to the respective +BTL IN and −BTL IN inputs of preamplifier audio 60.

Diodes D1 and D3 are used for reverse flow blocking and preferably have a low forward voltage drop. They will be in conduction mode anytime the forward conduction voltage of the diodes is achieved. Although, this creates a minimum input power requirement for this embodiment to operate, positive rectification and DC blocking is preferred to prevent reverse current back to the BTL amplifier. DC blocking also ensures that the voltages after D1 and D3 do not fall below a minimum operating voltage requirement of conventional boost converters U1 and U3 of boost regulator 36A and 36B. D1 and D3 should be selected to provide sufficient current handling capacity based on the current regulation point of the switch mode regulators 36A and 36B as is known in the art. The invention is not strictly limited to the use of diodes as discussed immediately above. Those of ordinary skill will readily appreciate that any circuit element(s) capable of forward conduction and blocking reverse conduction may be used in place of D1 and D3 in all embodiments of the invention.

R1 and R2 of voltage hold up circuit 84 sum the positive and negative input voltages. The summed result is a DC voltage which is the difference between the positive and negative outputs of the BTL amplifier. In the context of an automobile audio system, this DC voltage value is typically ½ the vehicle's primary battery voltage minus component conduction losses. This voltage is applied to the Vin pin of converter U1 through diode D5 and to the cathode of diode D1 through the drain-source channel of transistor Q1. The hold-up circuit keeps the magnitude of the single-ended input power signal above the minimum operating voltage of converter U1 of boost regulator 36A. Additional diodes can be added in series with diode D5 to lower the voltages at Vin and at the cathode of diode D1 to a preferred level if desired. The resulting voltage is presented to the cathode of diode D1 by virtue of the conduction of Q1 and that dictates how far beyond the BTL output zero crossing 51 diode D1 will conduct. The lower the voltage presented to the cathode of diode D1, the further it will conduct beyond zero crossing 51 and this is how the aforementioned distortion may be essentially eliminated. However, it is important that the voltage applied to Vin not fall below the minimum operating voltage of converter U1 throughout the entire cycle of the input signal.

It is important to note that in this embodiment (FIG. 6A), diodes D1 and D3 are separated/electrically-isolated from one another by various circuit elements and are applied to separate boost regulators. As such, they each output independent and asymmetric single-ended power signals, the exact details of which depend on the circuitry used to implement a boost amplifier in accordance with this embodiment. Regardless of the details, what is important about this circuitry is that it permits D1 and D3 to conduct (to be forward biased) when the balanced audio signals cross their zero-crossing point. In this way, distortion that would otherwise stem from reverse diode bias at or near the zero-crossing point and thereby distort the incoming balanced audio signals does not arise; this ensures that the audio signals presented to the audio amplifier are also not distorted. Naturally, this means that the amplified signals applied to load 16 can also be closer to linearity/ideality.

However, while the more elaborate circuitry of the embodiment of FIG. 6A solves the aforementioned problems with respect to rectifiers D1 and D3, it has the potential to introduce a similar distortion problem with respect to diodes/rectifiers D2 and D4. To eliminate that potential problem, it is desirable that regulators 36A and 36B operate at the same frequency and they target the same voltage. In this way, reverse bias of D2 and D4 at critical times may be avoided. Further, those of skill in the art will note that the Vsense terminal on regulators are not necessarily directly connected to HV+ with no other circuitry. For example, where the desired voltage HV+ is outside of the specified operating range of the Vsense terminal, a voltage divider (not shown) may be used to lower the voltage input into the Vsense terminal compared to HV+. This is a mere matter of design choice. Similarly, it may desirable to make the aforementioned voltage divider adjustable (also not shown) to better suit particular applications of the invention. Those of ordinary skill will readily appreciate these aspects of this most preferred embodiment discussed in this paragraph since they are not necessarily part of the claimed invention.

It is also important to note that boost regulators 36A and 36B can only perform their intended functions after various voltages reach quiescent levels. Before that, on startup, it is still desirable to prevent an unregulated current path from the BTL amplifier output to the DC power reservoir of the amplifier that would otherwise cause most BTL amplifiers to malfunction/shut-down. In particular, if current sourced from the preceding BTL amplifier is above its rated current capacity during system startup, it may cause the BTL amplifier to go into protection mode. If that happens, the AC and DC BTL output voltages typically reduce to a value near ground. Since the Vin voltage must be above the minimum operating threshold of the converter U1 to operate properly, it is important that the BTL amplifier never enter protection mode when paired with the boost amplifier of the present invention.

More particularly, as is known, both of the non-inverting and inverting outputs of the BTL amplifier increase from zero to the DC resting voltage at initial turn on. Thus, when connected to the BTL outputs, the positive and negative inputs of the amplifier increase at the same rate and some time is required for these voltages to reach the operating voltage of converter U1. Since converter U1 will not initialize until the voltage at Vin is above its minimum operating threshold, it will not regulate input current until Vin reaches that level. Thus, the near short-circuit path to ground would harm most BTL amplifiers if this condition were allowed to arise and current limiters 82 and 88 prevent this.

On a component level, Q1 is a P-CH enhancement mode MOSFET and, in conjunction with C3 and R3, performs the input surge current limit function described herein. See FIGS. 8A and 8B. Q1 is initially off, and slowly turns on depending on the values of C3 and R3. C3 charges up immediately to a voltage level that is close to the DC value at the cathode of diode D1 and then begins to slowly discharge through R3. Q1 is only fully on after its turn on Vgs threshold voltage has been reached. Thus, in the absence of Q1, an unregulated current path exists from the BTL amplifier output to the DC power reservoir of the amplifier (+BTL IN through D1, RS1, L1, and D2) but with this circuit, current is still limited until regulators 36A and 36B activate. In sum, the current surge limiter prevents the BTL amplifier from exceeding its output current capacity during an initial startup period.

With continuing joint reference to FIGS. 6 and 6A, the current sense resistors RS3 and RS4, in conjunction with Q2 and Q4, of current limit select circuits 80 and 86 provide the ability to adjust the input current regulation value (means for adjusting). This is achieved by setting the level at which Q2 and Q4 turn on. RS3 is in parallel with RS1 when Q2 is on and RS4 is in parallel with RS2 when Q4 is on. Paralleling sense resistors in this way increases the current sense regulation points of both the positive and negative inputs. The ability to adjust the current regulation is highly desirable when matching the amplifier to a particular BTL amplifier because it helps ensure a high power transfer rate to the boost amplifier while still ensuring that the output current capacity of the BTL amplifier is not exceeded The presence of current limit select circuits 80 and 86 allows this embodiment of the invention to be used with BTL amplifiers that have different output current capabilities. As is known, the output impedance drive capacity of most BTL amplifiers is either 4 Ohms or 2 Ohms. A BTL amplifier that is rated to drive a 2 Ohm load typically has more output current capacity than one that is rated to drive a 4 Ohm load. If the input current regulation value is set below the capacity of the BTL amplifier output, more storage capacitance within the DC power reservoir of the inventive boost amplifier may be required to achieve the desired dynamic output power rating of the invention. Thus, matching input current regulation of the inventive boost amplifier to the output current capacity of a particular BTL amplifier allows for optimal use of the BTL amplifier's output power capacity. This is preferably achieved by applying different voltages to the "mode" terminal of limiters 80 and 86. This, for example, may be done with a simple selector or DIP switch (not shown) that applies any one of +HV, LV or HALF LV to "mode" terminal. Changing the voltage at these points in the preferred circuit provides a user with a simple means for adjusting current limits to optimize use with different BTL amplifiers.

Turning now to boost regulators 36A and 36B as shown in FIGS. 6 and 6A, conventional boost converters/integrated-switches/control-circuits U1 and U3 are the heart of switch mode boost regulators 36A and 36B. The most preferred switch mode converter for use in the boost regulators of this embodiment bears generic model number MC33063A; various versions of which are manufactured by multiple semiconductor manufacturers including Texas Instruments Incorporated of 12500 TI Boulevard, Dallas, Tex. 75243; Fairchild Semiconductor Corp. of 3030 Orchard Parkway, San Jose, Calif. 95134; and ON Semiconductor Corporation of 1900 S County Trail, East Greenwich, R.I. 02818. However, those of skill in the art will recognize that any conventional boost converter with the ability to regulate current and voltage output can be used in the present invention.

Focusing now on boost converter U1 as used in this embodiment, U1 monitors the input current "Isense" and the DC power reservoir output voltage "Vsense" and varies a switching duty cycle depending on these parameters. The input current is measured through current sense resister RS1 and the output voltage is measured at the output of the DC power reservoir (+HV). The output of U1 switches Q5 either on or off. The output switching frequency of U1 is predetermined. Duty cycle will increase when the output voltage and/or the input current is below predetermined values. Duty cycle will decrease when the output voltage and/or the input current is above predetermined values. Those of skill in the art will readily understand equivalent control systems (such as frequency modulation) that could be used in the present invention in place of the pulse width modulation arrangement discussed herein and the invention is intended to cover all such equivalent arrangements/systems.

L1 is the boost regulator's inductor. Its value is determined by the magnitude of the +BTL signal received at input 32, the switching frequency of the converter U1, the saturation voltage of Q5, and the peak current through Q5. The purpose of L1 is to store energy during switching transitions of Q5. Its stored energy is transferred to the DC power reservoir during the off period of Q5.

Q5 switches the output of L1 to ground at the switching frequency of the boost regulator 36A. Its purpose is to charge L1 at each positive transition of the switching frequency presented to its gate. When switched on, Q5 shorts the output of L1 to ground, storing energy in L1. When Q5 is switched off, the stored energy of L1 is released and transferred from L1 through D2 to the DC power reservoir 38. The switching frequency is pulse width modulated to maintain the specified current regulation and output voltage of the boost regulator 36A.

D2 rectifies the output voltage of L1 and connects it to the power supply charge reservoir/storage provided by C1 and C2. C1 and C2 form the energy storage for amplifier U2. The value of C1 and C2 are determined by dynamic output power requirement of the amplifier and energy transfer efficiency from the DC power reservoir. The dynamic output power measurement method is described in EIA-RS-490 and CEA-2006-B. It is preferred that both C1 and C2 have a low ESR rating, as they are the primary charge reservoir for the amplifier.

Choosing the dynamic power measurement standard defines the maximum achievable ratio of dynamic output power to input power for an ideal system (100% efficient power converters, amplifiers, etc,). The input power is defined as the stock BTL amplifier's power output capacity. Calculating the effective average power delivery of the chosen dynamic power standard and then equating it to the input power capacity leads to a simple ratio formula for maximum achievable dynamic power gain:

$$Gdyn = \frac{Pdyn}{Pin(avg)} \text{Maximum Dynamic Power Gain} \qquad \text{Eq.X.1}$$

A general equation for the average power delivery of a particular dynamic power standard with a load condition period ton, an off condition period toff, and off condition power attenuation factor k, and total burst cycle period tcyc can be created:

$$Pout(avg) = \frac{(ton \cdot Pdyn) + (toff \cdot k \cdot Pdyn)}{tcyc} [\text{Watts}]$$

Equating the average output power to input power and solving for Pdyn produces the formula:

$$Pdyn = \frac{tcyc}{ton + k \cdot toff} \cdot Pin(avg) \qquad \text{Eq X.2}$$

For example, the dynamic power standards EIA-RS-490 and CEA-2006-B have identical definitions for the burst voltage waveform used to measure dynamic power. Calculation of the effective average power of the 20 ms full dynamic power sine, followed by a 480 ms, −20 dB sine (i.e. $\frac{1}{100}^{th}$ full dynamic power) burst waveform is as follows:

$$Pout(avg) = \frac{(20 \text{ ms} \cdot Pdyn) + (480 \text{ ms} \cdot 0.01 \cdot Pdyn)}{500 \text{ ms}} = 0.05 \cdot Pdyn [\text{Watts}]$$

Now using the conservation-of-energy law and equating the average output power to input power:

$Pout(avg) = Pin(avg) = 0.05 \cdot Pdyn$ [Watts]

therefore $Pdyn = 20 \cdot Pin(avg)$ [Watts]

Resulting in a maximum dynamic power gain calculation for EIA-RS-490 and CEA-2006-B of:

$$Gdyn = \frac{20 \cdot Pin(avg)}{Pin(avg)} = 20:1$$

The inverse of the maximum dynamic power gain describes the Duty Cycle of the dynamic waveform:

$$\text{Duty Cycle} = \frac{1}{Gdyn}$$

In this example, the EIA-RS-490 and CEA-2006-B Duty Cycle is:

Duty Cycle=$\frac{1}{20}$=0.05

To begin calculating component values, the designer must first know the output power capacity of the preceding BTL amplifier, which determines Pin(avg). A dynamic power measurement method must be chosen, the maximum dynamic power gain using Eq. X.2 and Eq. X.1 must be calculated, and a design goal that is less than this maximum must be set. Selection of the rated load resistance and the voltage rating of power supply capacitors C1 and C2 will be used to determine the capacitor value required to achieve the desired dynamic power design goal. Using the selected values of load resistance and dynamic power, find the peak voltage of the output sine wave during the load condition:

$$Vout(pk) = 1.414 \cdot \sqrt{Pdyn \cdot Rload} [\text{Volts}] \qquad \text{Eq. X.4}$$

Assuming the design goal for dynamic power gain is greater than 1:1, the output power demand during the load condition period of the waveform will always exceed the input power capacity, resulting in depletion of energy stored in C1 and C2, and a decrease in power supply voltage. To prevent clipping distortion of the output signal during load condition, this power supply voltage must remain higher than the peak output voltage, making it necessary for the voltage rating of the capacitors and the regulation voltage of the boost converters be set higher than the peak output voltage. The amount of 'voltage headroom' Vhr selected for the power supply will determine the required capacitance value to meet the dynamic power goal without clipping distortion (see FIG. 10 Vsupply). By using conservation-of-energy equations, the total value for C1 and C2 can be calculated.

The energy equations are made at the power supply capacitor node, where Ein is the energy in from the boost converters, Ec is the charging energy of C1 and C2 (where a positive number is charging, and negative is discharging), and Eout is the energy to the load:

$Ein = Ec + Eout$ [Joules]

therefore $Ec = Ein - Eout$ [Joules] \qquad Eq. X.3

During the load condition period ton, the amount of energy depleted from the capacitor can be calculated from Eq. X.3:

$Ec = Ein - Eout = Pin(avg)*ton - Pdyn*ton$ [Joules] \qquad Eq. X.5

This will result in a negative number, representing discharging energy and a lowering of the voltage at the power supply capacitor node. Now using our chosen power supply rail (+HV), and peak output voltage Vpk, the energy depleted in the capacitors can be calculated:

$$\text{Let } Ct = \frac{C1}{2} = \frac{C2}{2}$$

The energy stored in the capacitors at the start of the on condition is:

$$E1 = \frac{1}{2} \cdot Ct \cdot (+HV)^2 [\text{Joules}]$$

The energy in the capacitors at the end of the on condition is:

$$E2 = \frac{1}{2} \cdot Ct \cdot (2 \cdot Vout(pk))^2 [\text{Joules}]$$

The difference of energy between the start and end of the on condition equals the amount of energy depleted from the capacitors:

$$Ec = E1 - E2 = \frac{1}{2} \cdot Ct \cdot (+HV^2 - (2 \cdot Vout(pk))^2)$$

Solving for Ct results in the minimum required capacitance to achieve the desired dynamic output power:

$$Ct = \frac{2 \cdot |Ec|}{(+HV^2 - 4 \cdot Vout(pk)^2)} = \frac{C1}{2} = \frac{C2}{2} \text{ [Farads]} \qquad \text{Eq.X.6}$$

As a practical example of a design, we can start by specifying the available input power as equal to the rated power of typical stock BTL amplifier of Pin(avg)=20 W. Next, choose EIA-RS-490 as the dynamic power standard. As shown previously, the maximum dynamic power gain for EIA-RS-490 is Gdyn=20. Rearranging Eq. X.1 allows for the calculation of maximum dynamic power in this example:

Example of Maximum $Pdyn=Gdyn \cdot Pin(avg)=°\cdot 20$ W=400W

The designer must choose a value smaller than 400 W. For this example let Pdyn=100 W. This design goal for dynamic power, and the specified input power, and the known ton=20 ms from dynamic power standard EIA-RS-490 allows us to find the required storage capacitor energy from Eq. X.5:

$Ec=Pin(avg)*ton-Pdyn*ton=20$ W·20 ms-100 W·20 ms=-1.6 Joules

We will also specify a load impedance that is commonly available Rload=2Ω. Now we can calculate the required peak output voltage from Eq. X.4:

$Vout(pk)=1.414 \cdot \sqrt{Pdyn \cdot Rload} = 1.414 \cdot \sqrt{100W \cdot 2\Omega} = 20V$ Referring to FIG. 6A, and considering the standard voltage ratings available for storage capacitors, choose 25V for the C1 and C2 capacitor voltage ratings. As shown in FIG. 6A, C1 and C2 are connected in series, resulting in a maximum allowed applied voltage of +HV=50V. To allow for long component life, it is generally considered wise to operate components well within specified ratings. With this in mind, derate by 10% and choose a boost regulation voltage of +HV=45V. Calculate the required storage capacitance from Eq. X.6

$$Ct = \frac{2 \cdot |Ec|}{(+HV^2 - (2 \cdot Vout(pk))^2)} = \frac{2 \cdot |-1.6 \text{ Joules}|}{(45 \text{ V}^2 - (2 \cdot 20 \text{ V})^2)} = 7,530 uF = \frac{C1}{2} = \frac{C2}{2}$$

and $C1=C2=2 \cdot Ct=15,060 \mu F$

This example shows that using commonly available components, the dynamic power of a stock BTL amplifier can be increased from 20 W to 100 W.

The most preferred opamp U4 for use in the audio preamplifier 60 of this embodiment is a conventional opamp bearing model number TL071 which is manufactured by Texas Instruments Incorporated of 12500 TI Boulevard, Dallas, Tex. 75243. However, those of skill in the art will appreciate that any conventional audio amplifier (means for receiving and amplifying)(or even simply a biased transistor) with the ability to amplify the current and/or voltage of audio signals can be used in the present invention. Naturally, every such audio amplifier will have a dynamic output power capacity.

Turning to the preferred audio power amplifier 40''', U2 represents a conventional integrated circuit that is the heart of power amplifier 40'''. Those of skill will appreciate that U2 can be any class of integrated amplifier such as Class A, Class B, Class A/B, and Class D that is biased conventionally. The class of amplifier chosen and its inherent efficiency will determine how much storage is required to fulfill the dynamic power rating of the amplifier (as defined by the EIA-RS-490 and CEA-2006-B dynamic power specification and as discussed herein). Class D amplifiers are preferred due to their higher power efficiency. The most preferred integrated audio power amp U2 for use in amp 40''' of this embodiment is conventional class D amplifier bearing model number IR4321 which is manufactured by International Rectifier Corporation of 101 N. Sepulveda Blvd., El Segundo, Calif. 90245. However, those of skill in the art will appreciate that any conventional audio power amplifier with the ability to amplify the current and/or voltage of audio signals can be used in the present invention.

RL represents the amplifier's speaker load 16. In conjunction with the amplitude of the audio input signal and amplifier gain, the value of RL will determine how much output power is delivered from the amplifier's power supply.

The amplifier's DC power reservoir stores energy sourced from the BTL amplifier that is not immediately used for the amplifier's load requirement. This stored energy surplus is utilized by the amplifier when the power delivered to its load exceeds the power output capacity of the preceding BTL amplifier. The amplifier's stored energy surplus is replenished when the power delivered to its load is within the power output capacity of the preceding BTL amplifier. In the embodiment of FIG. 6A, the DC power reservoir includes a low voltage regulator U5 and a half low voltage regulator U6. FIG. 6B is a schematic representation of the electrical circuitry of the low voltage regulator U5 and FIG. 6C is a schematic representation of the electrical circuitry of the half low voltage regulator U6. Those of ordinary skill will readily appreciate the structure and operation of U5 and U6 as shown. Naturally, U5 and U6 provide additional bias points for various components of boost amplifier 30' as shown in FIG. 6A.

FIG. 8A represents the input current 56' of the positive or negative input during BTL startup with surge current limit enabled. FIG. 8B shows the output voltage waveform of the startup surge limiters shown in the preferred embodiment of FIGS. 6 and 6A during the preceding amplifier's startup. FIG. 5A represents the input current 56 of the positive or negative input during BTL startup without surge current limiting. FIG. 5B represents the output voltage at the inverting or non-inverting output of the preceding BTL amplifier at start up with no audio output signal. BTL amplifiers will typically enter protection mode if load current is detected above a specified value during its turn on sequence. Once the voltage at the BTL outputs increase to their normal operating voltage (HALF HV) from ground, the startup protection is disabled. This protection feature is typically incorporated by the BTL amplifier manufacturer to detect shorts or low impedance at the BTL amplifier outputs during startup. The input surge current limit of the invention is adjustable by changing the values of R3 or C3 shown in FIG. 6A.

FIG. 9A shows a typical −BTL audio signal 70 as a function of time and FIG. 9B shows the input impedance 72 of either of the positive and negative inputs of the inventive boost amplifier as a function of time. As mentioned, the BTL amplifier may enter protection mode if the input impedance of the invention falls below the BTL amplifier's rated drive capacity. It is important that the input impedance of the amplifier is maintained above a certain value at all times during the duration of the BTL amplifier's output signal. In the case of FIG. 9B, for example, the minimum target input impedance value is 2 Ohms. Control of the minimum input impedance is achieved through input current regulation performed by the boost regulator. The current sense resistor RS1 as shown in FIG. 6A determines the current regulation value. The boost regulator's peak current value is inversely related to the present invention's minimum input impedance value and directly related to the BTL amplifier's peak protection current.

FIG. 10 is a graph showing the drop in +HV during the time from t=0 to t=ton. The amplifier's power supply rail (+HV) drops during the period from t=0 to t=ton since the power delivered to the load exceeds the power drawn from the preceding BTL amplifier. The amplifier's peak output voltage is just at or slightly above the voltage of the DC power reservoir for the final cycle of the sine wave burst. This ensures that distortion at the output of the amplifier is kept low during the dynamic burst.

While the present invention has been described in connection with what is presently considered to be the most practical and preferred embodiments, it is to be understood that the invention is not limited to the disclosed embodiments, but is intended to encompass the various modifications and equivalent arrangements included within the spirit and scope of the appended claims. With respect to the above description, for example, it is to be realized that the optimum dimensional relationships for the parts of the invention, including variations in size, materials, shape, form, function and manner of operation, assembly and use, are deemed readily apparent to one skilled in the art, and all equivalent relationships to those illustrated in the drawings and described in the specification are intended to be encompassed by the appended claims. Therefore, the foregoing is considered to be an illustrative, not exhaustive, description of the principles of the present invention.

Other than in the operating examples or where otherwise indicated, all numbers or expressions referring to quantities of ingredients, reaction conditions, etc. used in the specification and claims are to be understood as modified in all instances by the term "about." Accordingly, unless indicated to the contrary, the numerical parameters set forth in the following specification and attached claims are approximations that can vary depending upon the desired properties, which the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

For purposes of the description hereinafter, the terms "upper", "lower", "right", "left", "vertical", "horizontal", "top", "bottom", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

What is claimed is:

1. A boost amplifier for use with a load and a BTL audio amplifier that outputs balanced audio signals with both DC and AC components into a load, the BTL amplifier having a output current capacity and a dynamic output power capacity, the boost amplifier comprising:
    an audio amplifier that receives and amplifies at least one of the audio signals from the BTL amplifier, the audio amplifier having a dynamic output power capacity and applying the amplified audio signals to the load;
    at least one diode that receives at least one of the audio signals from the BTL amplifier and produces a single-ended input power signal;
    at least one boost regulator that converts the single-ended input power signal into at least one regulated power signal having a higher magnitude than the single-ended input power signal, the boost regulator presenting a variable input impedance to the BTL amplifier such that the output current capacity of the BTL amplifier is not exceeded; and
    a DC power reservoir that receives and stores power from the regulated power signal, the power reservoir being the only power source for the audio amplifier and supplying sufficient power to the audio amplifier that the dynamic output power capacity of the audio amplifier exceeds the dynamic output power capacity of the BTL amplifier.

2. The boost amplifier of claim 1 wherein
    each of the balanced audio signals of the BTL amplifier has a zero-crossing point at which the polarity of the balanced audio signals reverses;
    there are two diodes and one of the balanced audio signals of the BTL amplifier is applied to each one of the diodes such that two independent single-ended power signals are produced;
    both of the balanced audio signals of the BTL amplifier are also applied to the audio amplifier; and
    there are two boost regulators and one of the single-ended input power signals is applied to each one of the boost regulators such that both of the diodes are forward biased when the BTL audio signals cross the zero-crossing point whereby the boost amplifier does not distort the balanced audio signals output from the BTL amplifier when the BTL audio signals cross the zero-crossing point.

3. The boost amplifier of claim 2 wherein
    the balanced audio signals of the BTL amplifier are applied to the diodes such that two independent and asymmetric single-ended power signals are produced;
    the single-ended input power signals are applied to the boost regulators such each of the diodes asymmetrically conducts the BTL audio signals whereby the boost amplifier does not distort the balanced audio signals output from the BTL amplifier when the BTL audio signals cross the zero-crossing point.

4. The boost amplifier of claim 1 wherein the boost regulator comprises a switch mode boost regulator and wherein the single-ended input power signal is the only power supplied to the switch mode boost regulator.

5. The boost amplifier of claim 1 wherein the audio amplifier comprises an audio preamplifier and an audio power amplifier, and wherein the stored power supplied by the DC power reservoir to the audio amplifier is the only power supplied to the audio preamplifier and the audio power amplifier.

6. The boost amplifier of claim 1 wherein the boost regulator comprises a switch mode boost regulator and wherein the boost amplifier further comprises a current surge limiter that receives the single-ended input power signal from the diode, the current surge limiter keeping current output from the BTL amplifier below the output current capacity of the BTL amplifier during an initial startup period.

7. The boost amplifier of claim 1 wherein the boost regulator comprises a switch mode boost regulator with a minimum operating voltage, and wherein the boost amplifier further comprises a voltage hold up circuit that keeps the magnitude of the single-ended input power signal above the minimum operating voltage of the switch mode boost regulator.

8. The boost amplifier of claim 1 wherein
there is one diode that receives one of the audio signals of the BTL amplifier;
the other of the audio signals of the BTL amplifier is applied to the audio amplifier; and
there is one boost regulator that receives the single-ended input power signal and that converts the single-ended input power signal into a regulated single-ended power signal.

9. The boost amplifier of claim 1 wherein
there are two diodes and one of the audio signals of the BTL amplifier is applied to each one of the diodes to thereby produce one single-ended input power signal; and
there is one boost regulator that receives the single-ended input power signal and that converts the single-ended input power signal into a regulated bipolar power signal.

10. The boost amplifier of claim 1 wherein
there are two diodes and one of the two balanced audio signals of the BTL amplifier is applied to each one of the diodes to thereby produce two single-ended input power signals;
there is one boost regulator and that boost regulator comprises a switch mode boost regulator to which the two single-ended input power signals are applied; and
one of the balanced audio output signals of the BTL amplifier is also applied to the input of the audio amplifier.

11. The boost amplifier of claim 1 wherein the boost amplifier has an input current capacity and wherein the input current capacity of the boost amplifier is adjustable to be less than or equal to the output current capacity of the BTL amplifier.

12. A boost amplifier for use with a load and a BTL audio amplifier that outputs balanced audio signals with both DC and AC components into a load, the BTL amplifier having a output current capacity and a dynamic output power capacity, the boost amplifier comprising:

means for receiving and amplifying at least one of the audio signals from the BTL amplifier, the audio amplifier having a dynamic output power capacity and applying the amplified audio signals to the load;
means for receiving and rectifying at least one of the audio signals from the BTL amplifier, the means for receiving and rectifying producing at least one single-ended input power signal;
regulator means for converting the single-ended input power signal into at least one regulated power signal having a higher magnitude than the single-ended input power signal, the regulator means presenting a variable input impedance to the BTL amplifier such that the output current capacity of the BTL amplifier is not exceeded;
means for storing DC power received from the regulated power signal and for supplying sufficient power to the means for receiving and amplifying that the dynamic output power capacity of the audio amplifier exceeds the dynamic output power capacity of the BTL amplifier, the means for storing and supplying being the only power source for the means for receiving and amplifying.

13. The boost amplifier of claim 12 wherein
each of the balanced audio signals of the BTL amplifier has a zero-crossing point at which the polarity of the balanced audio signals reverses;
there are two means for receiving and rectifying, each of the means for receiving and rectifying is a diode, and one of the balanced audio signals of the BTL amplifier is applied to each one of the diodes such that two independent single-ended power signals are produced;
both of the balanced audio signals of the BTL amplifier are also applied to the means for receiving and amplifying; and
there are two regulator means and one of the single-ended input power signals is applied to each one of the regulator means such that both of the diodes are forward biased when the BTL audio signals cross the zero-crossing point whereby the boost amplifier does not distort the balanced audio signals output from the BTL amplifier when the BTL audio signals cross the zero-crossing point.

14. The boost amplifier of claim 13 wherein
the balanced audio signals of the BTL amplifier are applied to the diodes such that two independent and asymmetric single-ended power signals are produced;
the single-ended input power signals are applied to the regulators means such each of the diodes asymmetrically conducts the BTL audio signals whereby the boost amplifier does not distort the balanced audio signals output from the BTL amplifier when the BTL audio signals cross the zero-crossing point.

15. The boost amplifier of claim 14 wherein each of the regulator means comprises a switch mode boost regulator and wherein the single-ended input power signal is the only power supplied to the switch mode boost regulator.

16. The boost amplifier of claim 12 wherein the boost regulator comprises a switch mode boost regulator and wherein the single-ended input power signal is the only power supplied to the switch mode boost regulator.

17. The boost amplifier of claim 12 wherein means for receiving and amplifying comprises an audio preamplifier and an audio power amplifier, and wherein the stored power supplied by the DC power reservoir to the audio amplifier is the only power supplied to the audio preamplifier and the audio power amplifier.

18. The boost amplifier of claim 12 wherein the regulator means comprises a switch mode boost regulator and wherein the boost amplifier further comprises a current surge limiter that receives the single-ended input power signal from the means for receiving and rectifying, the current surge limiter keeping current output from the BTL amplifier below the output current capacity of the BTL amplifier during an initial startup period.

19. The boost amplifier of claim 12 wherein the regulator means comprises two switch mode boost regulators each with a minimum operating voltage, and wherein the boost amplifier further comprises a voltage hold up circuit that keeps the magnitude of the single-ended input power signal above the minimum operating voltage of the switch mode boost regulators.

20. A boost amplifier for use with a load and a BTL audio amplifier that outputs balanced audio signals with both DC and AC components into a load, the boost amplifier comprising:

an audio amplifier that receives and amplifies at least one of the audio signals from the BTL amplifier, the audio amplifier applying the amplified audio signals to the load;

at least one diode that receives at least one of the audio signals from the BTL amplifier and produces a single-ended input power signal;

at least one switch mode boost regulator that converts the single-ended input power signal into at least one regulated power signal having a higher magnitude than the single-ended input power signal, wherein the single-ended input power signal is the only power supplied to the switch mode boost regulator; and a DC power reservoir that receives and stores power from the regulated power signal, the power reservoir supplying sufficient power to operate the audio amplifier and being the only power source for the audio amplifier.

* * * * *